(12) United States Patent
Maki

(10) Patent No.: US 10,553,769 B2
(45) Date of Patent: Feb. 4, 2020

(54) LIGHT-EMITTING UNIT AND MANUFACTURING METHOD OF LIGHT-EMITTING UNIT

(71) Applicant: TOSHIBA HOKUTO ELECTRONICS CORPORATION, Asahikawa-Shi (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 2 days.

(21) Appl. No.: 15/078,404

(22) Filed: Mar. 23, 2016

(65) Prior Publication Data

US 2016/0276322 A1    Sep. 22, 2016

Related U.S. Application Data

(63) Continuation of application No. PCT/JP2014/006000, filed on Dec. 1, 2014.

(30) Foreign Application Priority Data

Dec. 2, 2013  (JP) .................. 2013-249453
Dec. 2, 2013  (JP) .................. 2013-249454

(Continued)

(51) Int. Cl.
  *H01L 33/62*    (2010.01)
  *H01L 25/075*   (2006.01)
  *H01L 33/56*    (2010.01)

(52) U.S. Cl.
  CPC .......... *H01L 33/62* (2013.01); *H01L 25/0753* (2013.01); *H01L 33/56* (2013.01); *H01L 2933/005* (2013.01); *H01L 2933/0066* (2013.01)

(58) Field of Classification Search
  CPC ..... H01L 24/81; H01L 2224/12–17519; H01L 25/0753; H01L 33/62; H01L 33/38;
  (Continued)

(56) References Cited

U.S. PATENT DOCUMENTS

7,952,107 B2    5/2011  Daniels et al.
8,044,415 B2   10/2011  Messere et al.
(Continued)

FOREIGN PATENT DOCUMENTS

CN   101297606 A   10/2008
JP   S60-262430 A  12/1985
(Continued)

OTHER PUBLICATIONS

Machine translation of JP2011228463, translated Feb. 16, 2019 (Year: 2019).*

(Continued)

*Primary Examiner* — Lauren R Bell
(74) *Attorney, Agent, or Firm* — Burr & Brown, PLLC

(57) ABSTRACT

A light transmissive first insulating film having light transmissive property to visible light, a second insulating film arranged opposite to the first insulating film, a plurality of conductor patterns formed of, for example, mesh patterns having the light transmissive property to the visible light and formed on a surface of at least one of the first insulating film and the second insulating film, a plurality of first light-emitting devices connected to any two conductor patterns of the plurality of conductor patterns, and a resin layer arranged between the first insulating film and the second insulating film to hold the first light-emitting devices are included.

1 Claim, 41 Drawing Sheets

(30) Foreign Application Priority Data

Dec. 2, 2013 (JP) .................. 2013-249456
Dec. 2, 2013 (JP) .................. 2013-249457

(58) Field of Classification Search
CPC ....... H01L 25/075–0756; H01L 25/048; H01L 25/167

See application file for complete search history.

(56) References Cited

U.S. PATENT DOCUMENTS

| | | | |
|---|---|---|---|
| 2005/0127379 A1 | 6/2005 | Nakata | |
| 2007/0059646 A1* | 3/2007 | Winscom | G03C 5/58 430/311 |
| 2009/0114928 A1* | 5/2009 | Messere | B32B 17/10 257/88 |
| 2009/0239318 A1 | 9/2009 | Nakamura et al. | |
| 2009/0261357 A1 | 10/2009 | Daniels | |
| 2010/0052189 A1 | 3/2010 | Sakurai et al. | |
| 2010/0096647 A1 | 4/2010 | Van Herpen et al. | |
| 2011/0193105 A1* | 8/2011 | Lerman | H01L 25/0753 257/88 |
| 2012/0113328 A1 | 5/2012 | Takeshima et al. | |
| 2013/0105852 A1* | 5/2013 | Lou | H01L 33/62 257/99 |
| 2013/0248916 A1* | 9/2013 | Suehiro | H01L 23/49827 257/99 |
| 2013/0285077 A1 | 10/2013 | Kojima et al. | |
| 2014/0362565 A1* | 12/2014 | Yao | H01L 25/0753 362/223 |
| 2015/0249069 A1* | 9/2015 | Yoshida | H01L 33/62 257/89 |

FOREIGN PATENT DOCUMENTS

| | | |
|---|---|---|
| JP | S61-006833 A | 1/1986 |
| JP | S61-194732 A | 8/1986 |
| JP | H7-122787 | 5/1995 |
| JP | 10-163258 A1 | 6/1998 |
| JP | H11-145381 A | 5/1999 |
| JP | H11-177147 A | 7/1999 |
| JP | 2000-227952 A | 8/2000 |
| JP | 2000-299411 A | 10/2000 |
| JP | 2001-176908 A | 6/2001 |
| JP | 2002-246418 A | 8/2002 |
| JP | 2007-081159 A1 | 3/2007 |
| JP | 2007-157895 A1 | 6/2007 |
| JP | 2008-034473 A | 2/2008 |
| JP | 2010-525504 A1 | 7/2010 |
| JP | 2011-029634 A1 | 2/2011 |
| JP | 2011-134926 | 7/2011 |
| JP | 2011-228463 A1 | 11/2011 |
| JP | 2011228463 A * | 11/2011 |
| JP | 2012-084855 A1 | 4/2012 |
| JP | 5533183 B2 | 6/2014 |

OTHER PUBLICATIONS

Chinese Office Action (with English translation), Chinese Application No. 201480048559.X, dated Jun. 27, 2017 (23 pages).
U.S. Appl. No. 15/078,321, filed Mar. 23, 2016, Keiichi Maki, 2016/0276561 A1, Sep. 22, 2016.
AZoM. "Gold/Tin Alloys (AU/SN)—Properties and Applications." Feb. 13, 2004. Accessed May 30, 2017 at http://www.azom.com/article.aspx?ArticleiD=2371, 2 pages.
Chinese Office Action and Search (and translation provided by foreign counsel) dated May 26, 2017 from a Chinese patent application (CN 201480048553.2) that is a family member of U.S. Appl. No. 15/078,321, 19 pages.
International Search Report and Written Opinion (Application No. PCT/JP2014/006000) dated Feb. 24, 2015.
International Search Report and Written Opinion (Application No. PCT/JP2014/005999) dated Mar. 10, 2015, 8 pages.

* cited by examiner

FIG.54

| d2\d1 | 1 | 5 | 10 | 20 | 30 | 50 | 1000 |
|---|---|---|---|---|---|---|---|
| 1000 | 99.80% | 99.00% | 98.01% | 96.04% | 94.09% | 90.25% | 81.00% |
| 500 | 99.60% | 98.01% | 96.04% | 92.16% | 88.36% | 81.00% | 64.00% |
| 300 | 99.30% | 96.69% | 93.44% | 87.11% | 81.00% | 69.44% | 44.44% |
| 200 | 99.00% | 95.06% | 90.25% | 81.00% | 72.25% | 56.25% | 25.00% |
| 100 | 98.01% | 90.25% | 81.00% | 64.00% | 49.00% | 25.00% | 0.00% |
| 70 | 97.16% | 86.22% | 73.47% | 51.02% | 32.65% | 8.16% | |
| 50 | 96.04% | 81.00% | 64.00% | 36.00% | 16.00% | 0.00% | |
| 30 | 93.44% | 69.44% | 44.44% | 11.11% | 0.00% | | |
| 10 | 81.00% | 25.00% | 0.00% | | | | |

LIGHT-EMITTING UNIT AND MANUFACTURING METHOD OF LIGHT-EMITTING UNIT

CROSS REFERENCE TO RELATED APPLICATIONS

This application is continuation of international Application No. PCT/JP2014/006000, filed on Dec. 1, 2014, which is based upon and claims the benefit of priority from the prior Japanese Patent Applications No. 2013-249453, No. 2013-249454, No. 2013-249456, and No. 2013-249457 filed on Dec. 2, 2013. The entire specifications, claims, and drawings of Japanese Patent Applications No. 2013-249453, No. 2013-249454, No. 2013-249456, and No. 2013-249457 are herein incorporated in this specification by reference.

FIELD

Embodiments of the present invention relate to a light-emitting unit, a luminescence device, and a manufacturing method of a light-emitting unit.

BACKGROUND

In recent years, greater importance has been placed on efforts for the purpose of reducing energy consumption. From such a background, LED (Light Emitting Diode) whose power consumption is relatively small has attracted attention as a next-generation light source. LED is small, has a low calorific value, and shows good responsiveness. Therefore, LED is widely used in indoor, outdoor, stationary, and mobile display devices, display lamps, various switches, signaling devices, and optical devices for general illumination.

Conventionally, the wire bonding method has been used to mount the above types of LED on a wiring board. However, the wire bonding method is not suitable for mounting an LED chip on a flexible material such as a flexible board. Thus, various techniques for mounting an LED chip without using the wire bonding method have been proposed.

In such a module, the LED chip is arranged between a pair of light transmissive films on which light transmissive electrodes are formed. In such a module, it is necessary to efficiently supply power to the LED chip while securing light transmissive property and flexibility of the module.

BRIEF DESCRIPTION OF DRAWINGS

FIG. 54 is a diagram showing a correspondence table showing a transmittance corresponding to a line width and pitch of a thin-film conductor constituting the conductor pattern.

DESCRIPTION OF EMBODIMENTS

A light-emitting unit according to the present disclosure includes a light transmissive first insulating film having light transmissive property to visible light, a second insulating film arranged opposite to the first insulating film, a plurality of conductor patterns formed of, for example, conductor patterns having the light transmissive property to the visible light and formed on a surface of at least one of the first insulating film and the second insulating film, a plurality of first light-emitting devices connected to any two conductor patterns of the plurality of conductor patterns, and a resin layer arranged between the first insulating film and the second insulating film to hold the first light-emitting devices.

According to the present embodiment, a light-emitting unit having light transmissive property or flexibility to light can be provided.

First Embodiment

Hereinafter, a first embodiment of the present invention will be described using the drawings. For the description, an XYZ coordinate system formed from an X axis, a Y axis, and a Z axis that are orthogonal to one another is used.

Figure 1:
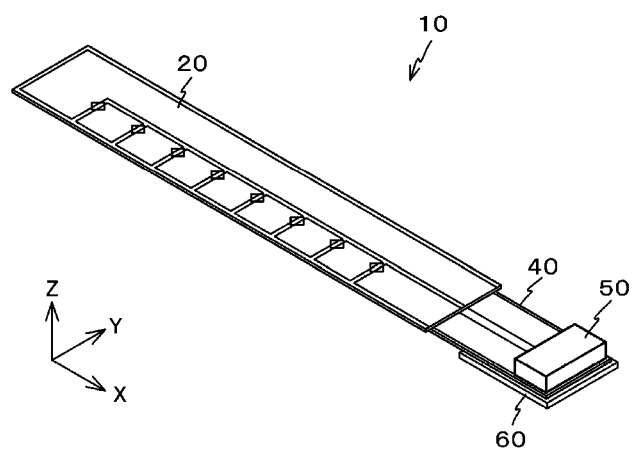
FIG. 1 is a perspective view of a light-emitting unit.
Figure 2:
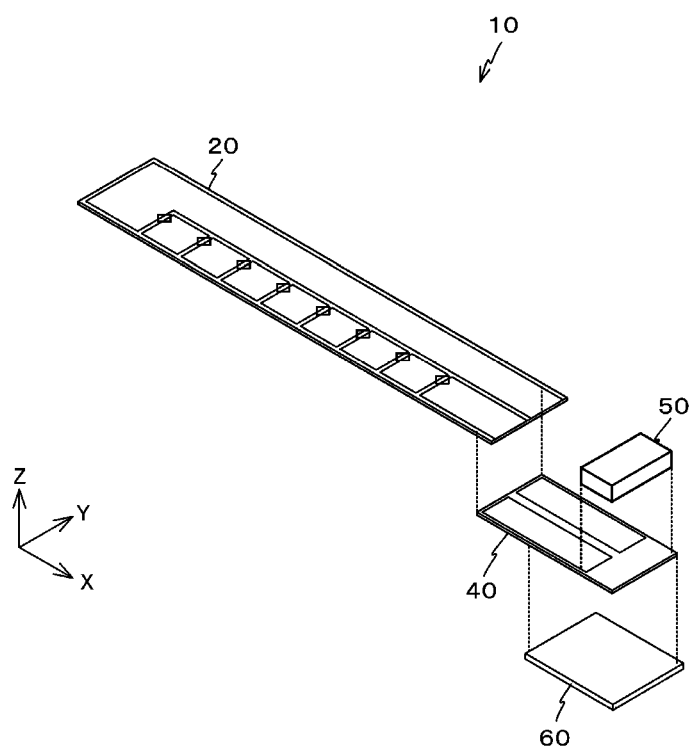
FIG. 2 is an exploded perspective view of the light-emitting unit.

FIG. 1 is a perspective view of a light-emitting unit 10 according to the present embodiment. FIG. 2 is an exploded perspective view of the light-emitting unit 10. As is evident from FIGS. 1 and 2, the light-emitting unit 10 includes a light-emitting panel 20, a flexible cable 40, a connector 50, and a reinforcing plate 60.

Figure 3:
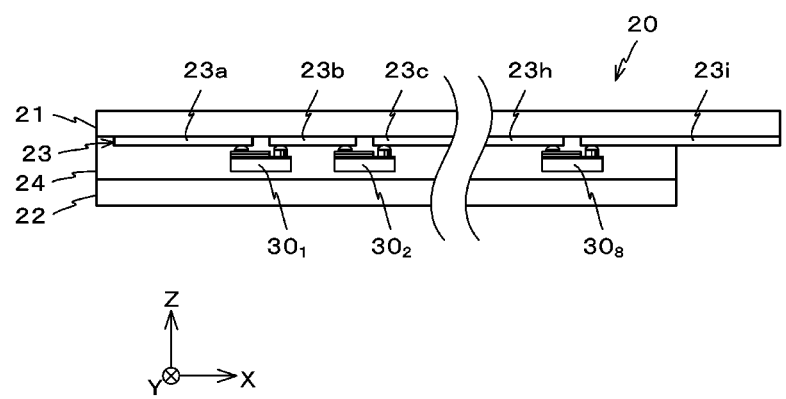
FIG. 3 is a side view of a light-emitting panel.

FIG. 3 is a side view of the light-emitting panel 20. As shown in FIG. 3, the light-emitting panel 20 includes a pair of light transmissive films 21, 22, a resin layer 24 formed between the light transmissive films 21, 22, and eight light-emitting devices 30$_1$ to 30$_8$ arranged inside the resin layer 24.

The light transmissive films 21, 22 are rectangular films whose longitudinal direction is the X-axis direction. The light transmissive film 21 has a thickness of about 50 to 300 μm and has light transmissive property to visible light. Total light beam transmittance of the light transmissive film 21 is preferably about 5 to 95%. The total light beam transmittance is total light transmittance measured in conformity with the Japanese Industrial Standard JISK7375:2008.

The light transmissive films 21, 22 have flexibility and the bending modulus of elasticity thereof is about 0 to 320 kgf/mm$^2$. The bending modulus of elasticity is a value measured by a method in conformity with ISO 178 (JIS K7171: 2008).

As the material of the light transmissive films 21, 22, using polyethylene terephthalate (PET), polyethylene naphthalate (PEN), polycarbonate (PC), polyethylene succinate (PES), ARTON, or acrylic resin can be considered.

A conductor layer 23 of the thickness of about 0.05 μm to 2 μm is formed on the undersurface (−Z side surface in FIG. 3) of the light transmissive film 21 of the pair of the light transmissive films 21, 22.

Figure 4:
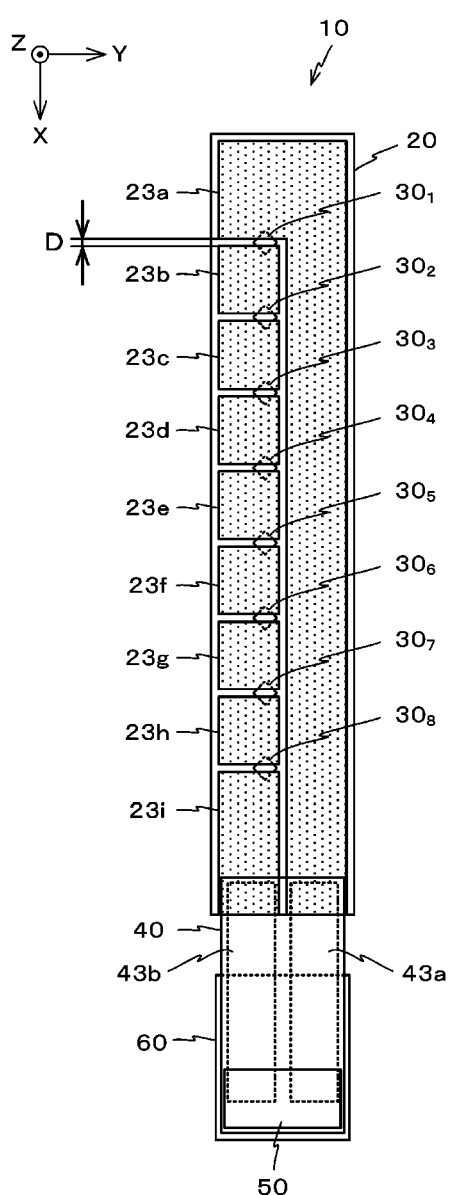
FIG. 4 is a plan view of the light-emitting unit.

FIG. 4 is a plan view of the light-emitting unit 10. As is evident from FIGS. 3 and 4, the conductor layer 23 includes a conductor pattern 23$a$ in an L shape formed along a +Y side outer edge of the light transmissive film 21 and conductor patterns 23$b$ to 23$i$ in a rectangular shape arranged along a −Y side outer edge of the light transmissive film 21. The conductor patterns 23$a$ to 23$i$ are conductor patterns made of a metallic material such as copper (Cu) and silver (Ag). In the light-emitting unit 10, a distance D between the conductor patterns 23$a$ to 23$i$ is about 100 μm or less. The light transmissive film 21 is completely covered with the conductor patterns 23$a$ to 23$i$ partitioned by a slit. Lower resistance can thereby be implemented. An L-shaped portion of the conductor pattern 23$a$ forms a folded portion.

In the light-emitting unit 10, the light transmissive film 22 has a shorter length in the X-axis direction than the light transmissive film 21. Thus, as is evident from FIG. 3, a +X side end of the conductor pattern 23$a$ and the conductor pattern 23$i$ constituting the conductor layer 23 is exposed.

The resin layer 24 is formed between the light transmissive films 21, 22. The resin layer 24 has light transmissive property to visible light.

The tensile storage modulus of the resin layer 24 at the Vicat softening temperature is 0.1 MPa or more. In addition, the melting temperature of the resin layer 24 is preferably 180° C. or more, or 40° C. higher than the Vicat softening temperature or more. Then, the glass transition temperature of the resin layer 24 is preferably −20° C. or less. As an elastomer used for the resin layer 24, an acrylic elastomer, an olefin elastomer, a styrene elastomer, an ester elastomer, and a urethane elastomer can be considered. The resin layer 24 has the Vicat softening temperature in the range of 80° C. to 160° C. and the tensile storage modulus thereof from 0° C. to 100° C. is in the range of 0.01 GPa to 10 GPa.

Figure 5:
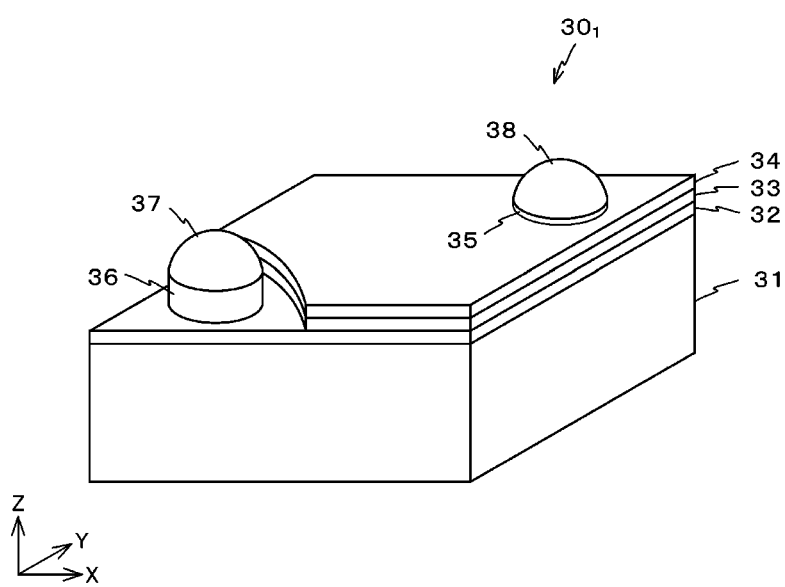
FIG. 5 is a perspective view of a light-emitting device.

The light-emitting device 30$_1$ is a square LED chip. As shown in FIG. 5, the light-emitting device 30$_1$ is an LED chip in a 4-layer structure including a base substrate 31, an N-type semiconductor layer 32, an active layer 33, and a P-type semiconductor layer 34. The rated voltage of the light-emitting device 30$_1$ is about 2.5 V.

The base substrate 31 is a sapphire substrate or a semiconductor substrate. The N-type semiconductor layer 32 in the same shape as the base substrate 31 is formed on the top surface of the base substrate 31. Then, the active layer 33 and the P-type semiconductor layer 34 are stacked on the top surface of the N-type semiconductor layer 32 in this order. The active layer 33 and the P-type semiconductor layer 34 stacked on the N-type semiconductor layer 32 have a notch formed on a −Y side and −X side corner to expose the surface of the N-type semiconductor layer. As the N-type semiconductor layer 32, the active layer 33, and the P-type semiconductor layer 34, for example, a compound semiconductor is used.

A pad 36 electrically connected to the N-type semiconductor layer 32 is formed in a portion of the N-type semiconductor layer 32 exposed from the active layer 33 and the P-type semiconductor layer 34. Also, a pad 35 electrically connected to the P-type semiconductor layer 34 is formed on a +X side and +Y side corner of the P-type semiconductor layer 34. The pads 35, 36 are made of copper (Cu) or gold (Au) and have bumps 37, 38 that are conductive formed on the top surface thereof respectively. The bumps 37, 38 are made of a metal bump of gold (Au), a gold alloy or the like and shaped in a semispherical form. As the metal bump, gold (Au), silver (Ag), copper (Cu), nickel (Ni), AuSn or an alloy of these metals can be used. Instead of the metal bump, a solder bump may be used. In the light-emitting device 30, the bump 37 functions as a cathode electrode and the bump 38 functions as an anode electrode.

Figure 6:
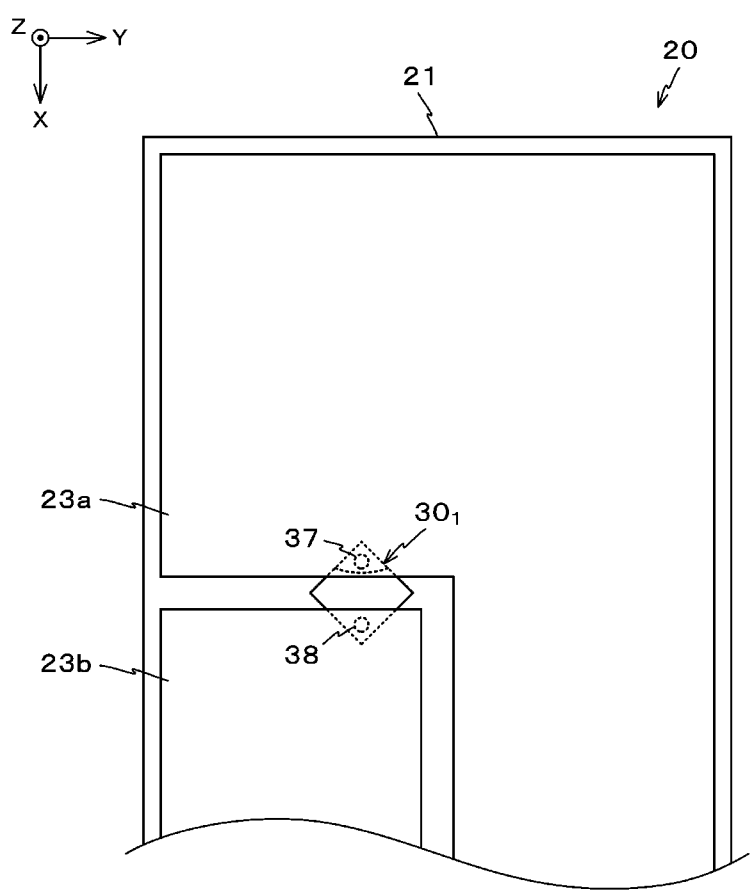
FIG. 6 is a diagram showing the light-emitting device connected to a conductor pattern.

The light-emitting device $30_1$ configured as described above is arranged, as shown in FIG. 6, between the conductor patterns 23a, 23b, the bump 37 is connected to the conductor pattern 23a, and the bump 38 is connected to the conductor pattern 23b.

Figure 7:
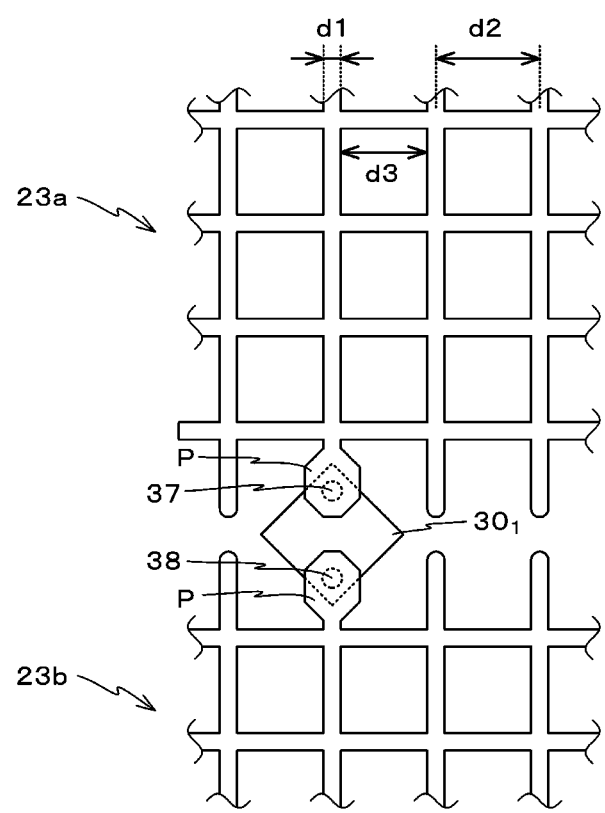
FIG. 7 is a diagram showing a state of the light-emitting device connected to the conductor pattern.

FIG. 7 is a diagram showing a state of the light-emitting device $30_1$ connected to the conductor patterns 23a, 23b. As is evident from FIG. 7, the conductor patterns 23a to 23i are made of a thin-film conductor whose line width d1 is about 10 μm and a pitch d2 of the thin-film conductor is about 300 μm. An inter-line distance d3 is 290 μm. Transmittance Pe of the conductor patterns 23a to 23i is given by the following formula. In the present embodiment, the transmittance Pe of the conductor patterns 23a to 23i is about 93.44%.

$$Pe=(d3 \times d3)/(d2 \times d2)=(d2-d1)2/d22$$

As shown in FIG. 7, the light-emitting device $30_1$ has the bump 37 connected to a connection pad P provided in the conductor pattern 23a and the bump 38 connected to a connection pad P provided in the conductor pattern 23b.

In the example of FIG. 7, the pitch of the bumps 37, 38 of the light-emitting device is twice the pitch d2 of thin-film conductors constituting the conductor patterns 23a, 23b or less and in this example, equal to the pitch d2.

The other light-emitting devices $30_2$ to $30_8$ have a configuration equal to the configuration of the light-emitting device $30_1$. Then, the light-emitting device $30_2$ is arranged between the conductor patterns 23b, 23c and the bumps 37, 38 are connected to the conductor patterns 23b, 23c respectively. Similarly, the light-emitting device $30_3$ is arranged by spreading over the conductor patterns 23c, 23d. The light-emitting device $30_4$ is arranged by spreading over the conductor patterns 23d, 23e. The light-emitting device $30_5$ is arranged by spreading over the conductor patterns 23e, 23f. The light-emitting device $30_6$ is arranged by spreading over the conductor patterns 23f, 23g. The light-emitting device $30_7$ is arranged by spreading over the conductor patterns 23g, 23h. The light-emitting device $30_8$ is arranged by spreading over the conductor patterns 23h, 23i. Accordingly, the conductor patterns 23a to 23i and the light-emitting devices $30_1$ to $30_8$ are connected in series. In the light-emitting panel 20, the light-emitting device 30 is arranged at intervals of 10 mm.

Figure 8:
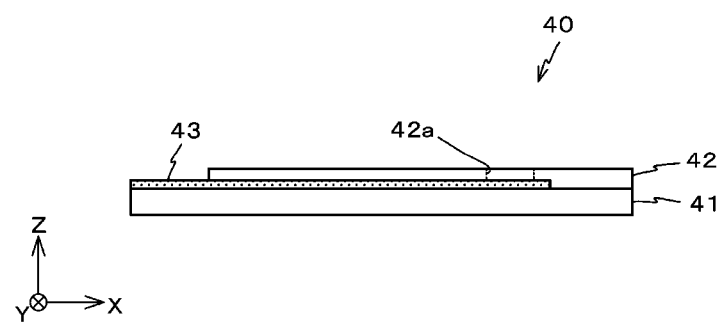
FIG. 8 is a side view of a flexible cable.

FIG. 8 is a side view of the flexible cable 40. As shown in FIG. 8, the flexible cable 40 includes a base material 41, a conductor layer 43, and a cover lay 42.

The base material 41 is a rectangular member whose longitudinal direction is the X-axis direction. The base material 41 is made of, for example, polyimide and has the conductor layer 43 formed on the top surface thereof. The conductor layer 43 is formed by patterning copper foil attached to the top surface of polyimide. In the present embodiment, as shown in FIG. 4, the conductor layer 43 is made of two conductor patterns 43a, 43b.

The conductor layer 43 formed on the top surface of the base material 41 is coated with the cover lay 42 bonded by vacuum thermo-compression. The cover lay 42 has, as shown in FIG. 8, a shorter length in the X-axis direction than the base material 41. Thus, the -X side end of the conductor patterns 43a, 43b constituting the conductor layer 43 is exposed. In addition, the cover lay 42 is provided with an opening 42a and a +X side end of the conductor patterns 43a, 43b is exposed through the opening 42a.

Figure 9:
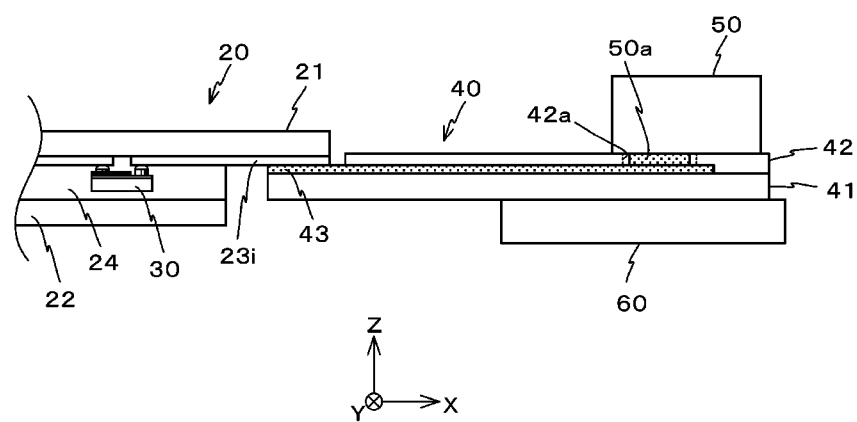
FIG. 9 is a diagram illustrating a procedure for connecting the light-emitting panel and the flexible cable.

As is evident from FIGS. 4 and 9, the flexible cable 40 configured as described above is bonded to the light-emitting panel 20 while the conductor patterns 43a, 43b exposed from the cover lay 42 are in contact with the +X side end of the conductor patterns 23a, 23i of the light-emitting panel 20.

As shown in FIG. 2, the connector 50 is a component in a rectangular parallelopiped shape and a cable routed from a DC power source is connected thereto. The connector 50 is implemented on the top surface of the +X side end of the flexible cable 40. If the connector 50 is implemented on the flexible cable 40, as shown in FIG. 9, each of a pair of terminals 50a of the connector 50 is connected to the conductor patterns 43a, 43b of the flexible cable 40 via the opening 42a provided in the cover lay 42.

As shown in FIG. 2, the reinforcing plate 60 is a plate member in a rectangular shape whose longitudinal direction is the X-axis direction. The reinforcing plate 60 is made of, for example, epoxy resin or acrylic. As shown in FIG. 9, the reinforcing plate 60 is attached to the undersurface of the flexible cable 40. Thus, the flexible cable 40 can be bent between the -X side end of the reinforcing plate 60 and the +X side end of the light-emitting panel 20.

Figure 10:
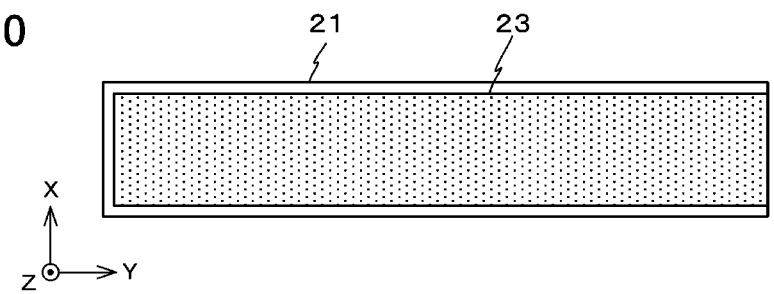
FIG. 10 is diagram illustrating the procedure for manufacturing the conductor pattern.

Next, the manufacturing method of the light-emitting panel 20 constituting the light-emitting unit 10 described above will be described. First, the light transmissive film 21 made of PET is prepared. Then, as shown in FIG. 10, the conductor layer 23 like a mesh is formed on the entire declaration of the light transmissive film 21 using a subtract method, an additive method or the like. Then, the conductor patterns 23a to 23i are formed by cutting the conductor layer 23 using an energy beam, for example, laser.

Figure 11:
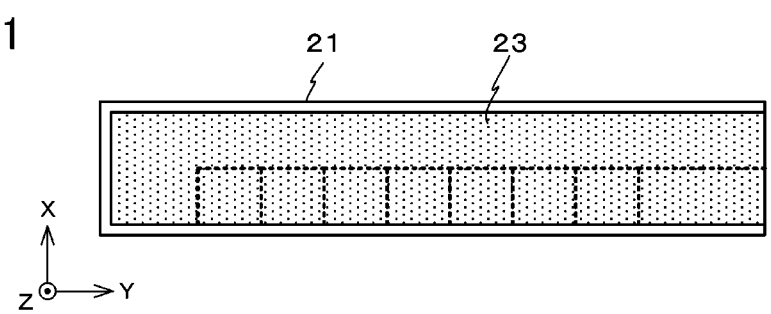
FIG. 11 is diagram illustrating the procedure for manufacturing the conductor pattern.
Figure 12:
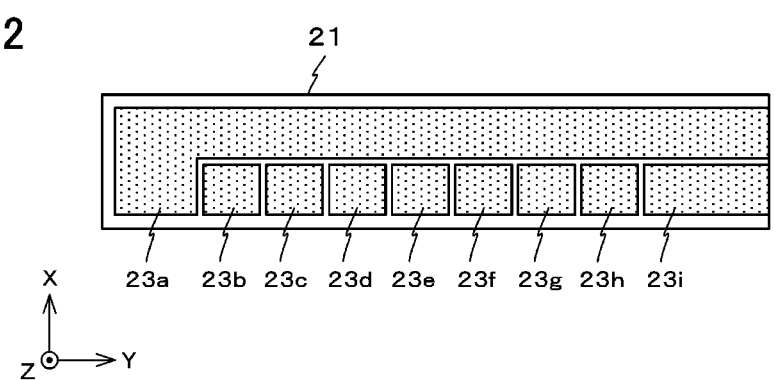
FIG. 12 is diagram illustrating the procedure for manufacturing the conductor pattern.

To cut the conductor layer 23, the conductor layer 23 formed on the surface of the light transmissive film 21 is irradiated with laser light. Then, the laser spot of the laser light is moved along a dotted line shown in FIG. 11. Accordingly, the conductor layer 23 is cut along the slit of the dotted line and, as shown in FIG. 12, the conductor patterns 23a to 23i are formed.

Figure 13:
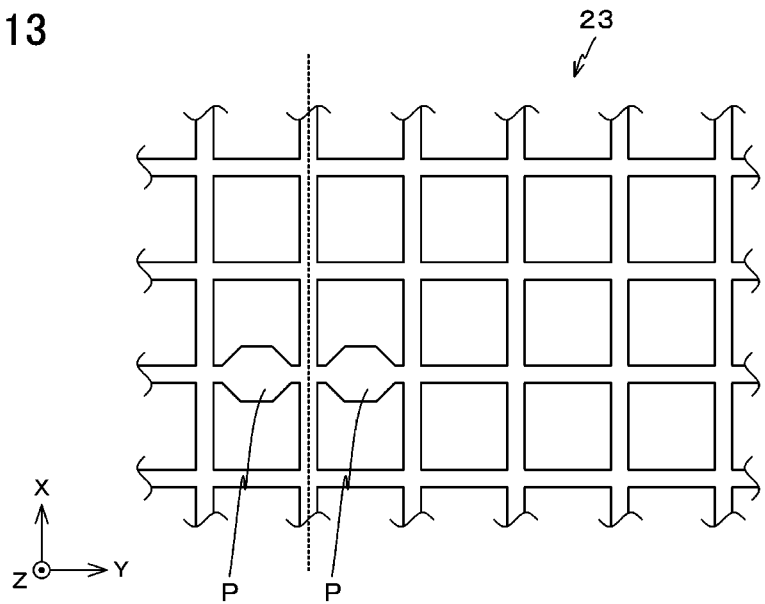
FIG. 13 is diagram illustrating the procedure for manufacturing the conductor pattern.
Figure 14:
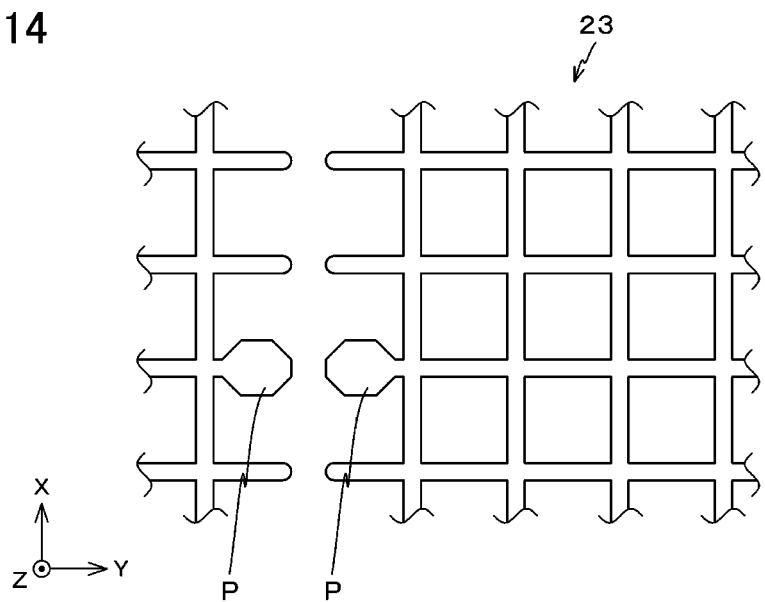
FIG. 14 is diagram illustrating the procedure for manufacturing the conductor pattern.
Figure 15:
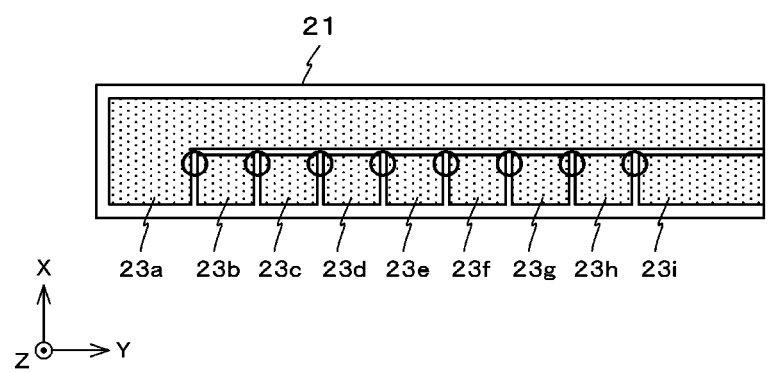
FIG. 15 is diagram illustrating the procedure for manufacturing the conductor pattern.

In the present embodiment, as shown in FIG. 13, the connection pad P is formed in the conductor layer 23 in advance. The connection pad P is provided so as to correspond to a position where the light-emitting device 30 is implemented when the conductor layer 23 is formed. When the laser spot of laser light moves on the surface of the conductor layer 23 along the dotted line shown in FIG. 13, a portion near the moving path of the laser spot is melted and sublimated. Accordingly, as shown in FIG. 14, the conductor patterns 23a to 23i are cut out and also a pair of connection pads P is formed. In the light-emitting panel 20, the pair of connection pads P is formed in places indicated by a black circle in FIG. 15.

In the example shown in FIGS. 13 and 14, the conductor patterns 23a to 23i in which the connection pads P are integrated are fragmented by laser light. However, if desired, the conductor patterns 23a to 23i with a connection pad in the final shape shown in FIG. 14 may be formed in one lithography process without dividing the process into two processes.

Alternatively, the connection pad shown in FIG. 13 may be made to be regularly scattered in, for example, a matrix shape in a conductor pattern using the conductor pattern shown in FIG. 13 so that the connection pad is selected and cut out by laser light along with the conductor pattern in accordance with the connection layout of light-emitting devices requested by each luminescence device. In this case, a connection pad not used to connect a light-emitting device remains as a dummy pad.

In such a case, an area to be used for a circuit has a cut-out pattern shown in FIG. 14 and an area not offered to the circuit has an initial pattern shown in FIG. 13. Thus, there are several methods for forming conductor patterns.

Figure 16:
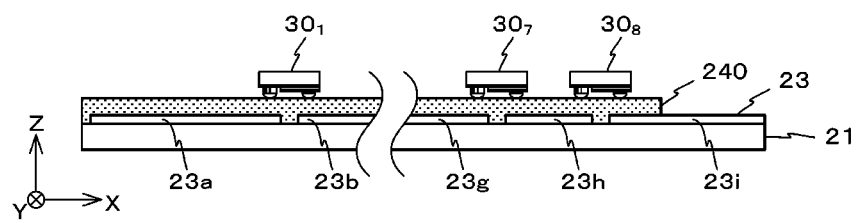
FIG. 16 is diagram illustrating the procedure for manufacturing the light-emitting panel.

Next, as shown in FIG. 16, a thermoplastic resin 240 is provided on the surface of the light transmissive film 21 on which the conductor patterns 23a to 23i are formed. Then, the light-emitting devices $30_1$ to $30_8$ are arranged on the thermoplastic resin 240. At this point, the light-emitting devices $30_1$ to $30_8$ are positioned such that the connection pad P formed in the conductor patterns 23a to 23i is positioned immediately below the bumps 37, 38 of the light-emitting devices $30_1$ to $30_8$.

Figure 17:
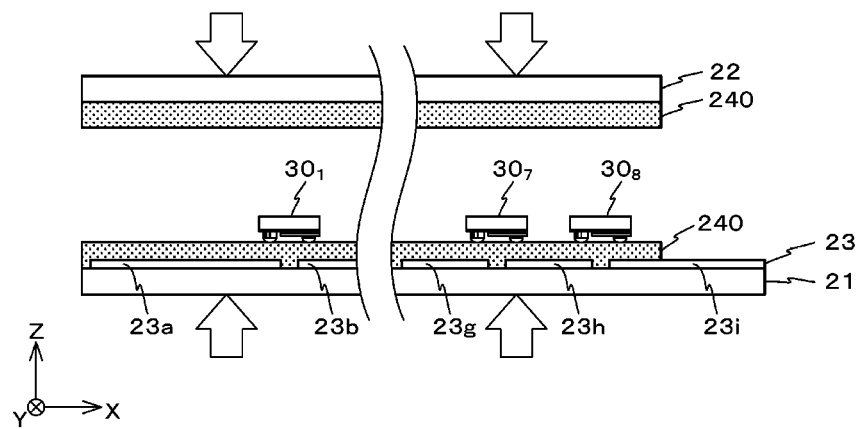
FIG. 17 is diagram illustrating the procedure for manufacturing the light-emitting panel.

Next, as shown in FIG. 17, the light transmissive film 22 provided with the thermoplastic resin 240 on the undersurface thereof is arranged on the top surface side of the light transmissive film 21. Then, each of the light transmissive films 21, 22 is crimped by heating in a vacuum atmosphere. Accordingly, first the bumps 37, 38 formed in the light-emitting device 30 penetrate the thermoplastic resin 240 to reach the conductor patterns 23a to 23i to be electrically connected to the conductor patterns 23a to 23i. Then, a space between a conductor pattern 25 and the light transmissive films 21, 22, and the light-emitting device 30 is completely filled with the thermoplastic resin 240. The thermoplastic resin 240 becomes, as shown in FIG. 3, the resin layer 24 that holds the light-emitting device 30 between the light transmissive films 21, 22. The light-emitting panel 20 is finished by undergoing the above processes.

The thermoplastic resin 240 in a sheet shape may be used or the thermoplastic resin 240 may be applied. Only the thermoplastic resin 240 on the lower side may be used without using the thermoplastic resin 240 on the upper side. After electric connection of the electrode and conductor patterns is obtained by compressing the whole in which the light-emitting devices are sandwiched using the thermoplastic resin 240 in upper and lower two layers, a similar configuration may be obtained by peeling the thermoplastic resin 240 positioned on the opposite side of the electrode of the light-emitting device of the two-layer thermoplastic resin 240 and attaching the thermoplastic resin 240 having the same thickness as the thermoplastic resin 240 having been peeled to the light transmissive film 22 in the final stage. The thermoplastic resin 240 is, for example, a thermoplastic elastomer. The thermoplastic resin is used as the resin layer, but the present embodiment is not limited to such an example.

As shown in FIG. 9, the flexible cable 40 to which the reinforcing plate 60 is attached is connected to the light-emitting panel 20 configured as described above and the connector 50 is implemented on the flexible cable 40 to finish the light-emitting unit 10 shown in FIG. 1.

In the light-emitting unit 10 configured as described above, when a DC voltage is applied to the conductor patterns 43a, 43b shown in FIG. 4 via the connector 50, the light-emitting device 30 constituting the light-emitting panel 20 emits light. The rated voltage of the light-emitting device 30 is about 2.5 V and thus, the voltage of about 20 V is applied to the conductor patterns 43a, 43b in the light-emitting unit 10.

Figure 18:
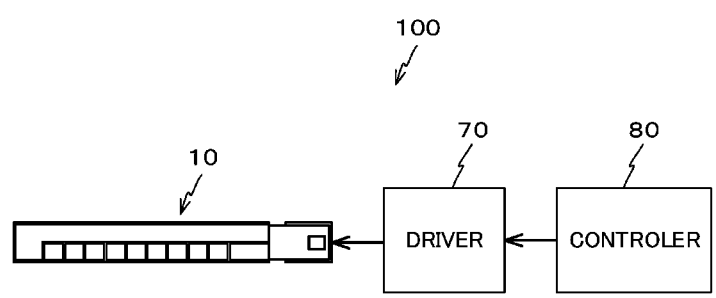
FIG. 18 is a block diagram of a luminescence device including a light-emitting unit.

FIG. 18 is a block diagram of a luminescence device 100 including the light-emitting unit 10. As shown in FIG. 18, the luminescence device 100 configured as described above is used together with a driver 70 and a controller 80 that controls the driver 70.

The controller 80 includes a CPU (Central Processing Unit), a main storage unit to be a work area of the CPU, and an auxiliary storage unit that stores a program executed by the CPU. A drive signal is output to the driver 70 by the controller 80 by the program being read from the auxiliary storage unit and executed by the CPU. The driver 70 applies a DC voltage to the light-emitting unit 10 based on instructions of the controller 80. Accordingly, the light-emitting unit 10 is controlled based on the program.

In the present embodiment, as described above, the light-emitting device 30 is connected by the conductor patterns 23a to 23i. These conductor patterns 23a to 23i are formed from a metal thin film whose line width is about 10 μm. Metals such as copper (Cu) and silver (Ag) are opaque metallic materials, but an opening in a mesh pattern allows light to pass through. Thus, light transmissive property and flexibility of the light-emitting panel 20 can sufficiently be secured. Because the conductor patterns 23a to 23i are formed in a plane shape, the resistance of the circuit that supplies power to the light-emitting device 30 can be reduced. Accordingly, power can efficiently be supplied to the light-emitting device.

In the present embodiment, the conductor layer 23 formed from the conductor patterns 23a to 23i is formed on the top surface of the light transmissive film 21 of the pair of light transmissive films 21, 22. Thus, the light-emitting panel 20 according to the present embodiment is thinner than a light-emitting panel having a conductor layer formed on both of the top surface and the undersurface of the light-emitting device 30. As a result, flexibility and light transmissive property of the light-emitting panel 20 can be improved.

Figure 19:
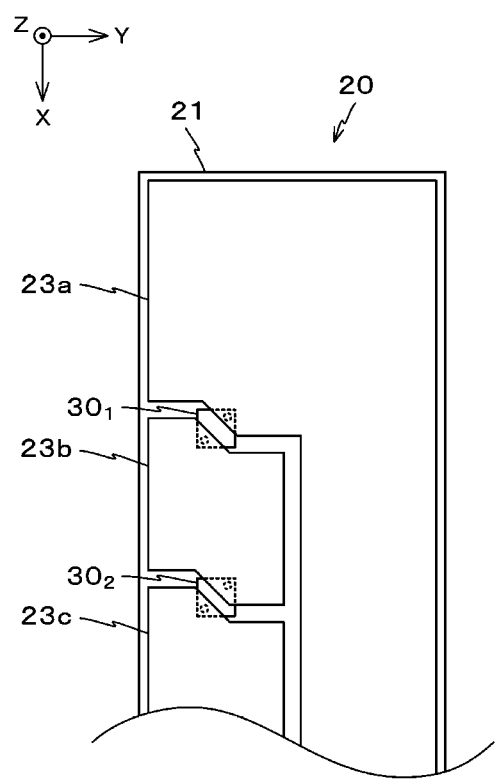
FIG. 19 is a diagram showing a modification of the conductor pattern.

In the above embodiment, a case in which the conductor patterns 23b to 23i are rectangular is described. However, the above embodiment is not limited to such a case and, as shown in FIG. 19, the outer edge of the conductor patterns 23b to 23i may be bent. In such a case, the light-emitting device 30 can be arranged such that the outer edge thereof is parallel to the X axis.

Figure 20:
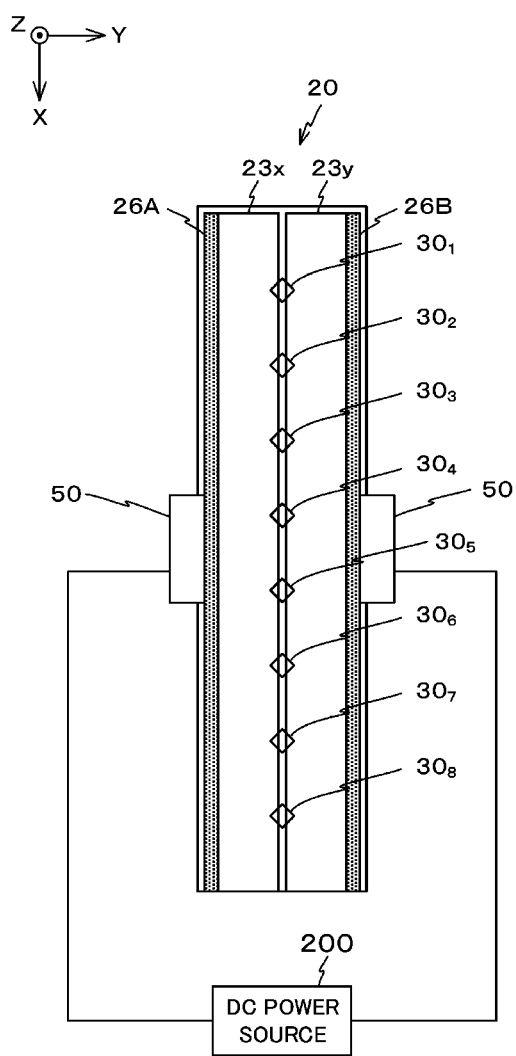
FIG. 20 is a diagram showing a modification of the light-emitting panel.

In the above embodiment, a case in which the light-emitting devices 30 are connected in series is described. However, the above embodiment is not limited to such a case and the light-emitting devices 30 may be connected in parallel. FIG. 20 is a diagram showing the light-emitting panel 20 according to a modification. The light-emitting panel 20 includes a pair of conductor patterns 23x, 23y whose longitudinal direction is the X-axis direction in the light transmissive film 21. A conductor pattern 26A made of copper or silver is connected to the entire outer edge on the −Y side of the conductor pattern 23x. Also, a conductor pattern 26B made of copper or silver is connected to the entire outer edge on the +Y side of the conductor pattern 23$y$. The line width of these conductor patterns 26A, 26B is extremely larger than the line width of a metal thin film constituting the conductor patterns 23$y$, 23$x$.

Each of the light-emitting devices $30_1$ to $30_8$ is arranged along the X axis while the bump 37 is connected to the conductor pattern 23$x$ and the bump 38 is connected to the conductor pattern 23$y$.

In the light-emitting panel 20 according to the present modification, a DC power source 200 is connected to between the conductor pattern 26A and the conductor pattern 26B via the connector 50. When a voltage is applied to between the conductor pattern 26A and the conductor pattern 26B by the DC power source 200, a voltage is applied to each of the light-emitting devices $30_1$ to $30_8$. Accordingly, the light-emitting devices $30_1$ to $30_8$ emit light.

In the light-emitting panel 20 configured as described above, the conductor pattern 26A made of copper or silver is connected to the entire outer edge on the −Y side of the conductor pattern 23$x$. Also, the conductor pattern 26B made of copper or silver is connected to the entire outer edge on the +Y side of the conductor pattern 23$y$. The resistance value per unit volume of the conductor patterns 26A, 26B is extremely smaller than the resistance value per unit volume of the conductor patterns 23$x$, 23$y$.

Thus, by providing the conductor pattern 26A next to the conductor patterns 23$x$, 23$y$, the current density of the conductor patterns 23$x$, 23$y$ is made uniform and variations of the voltage applied to each of the light-emitting devices $30_1$ to $30_8$ are eliminated. Therefore, brightness of each of the light-emitting devices $30_1$ to $30_8$ can be made uniform.

Figure 21:
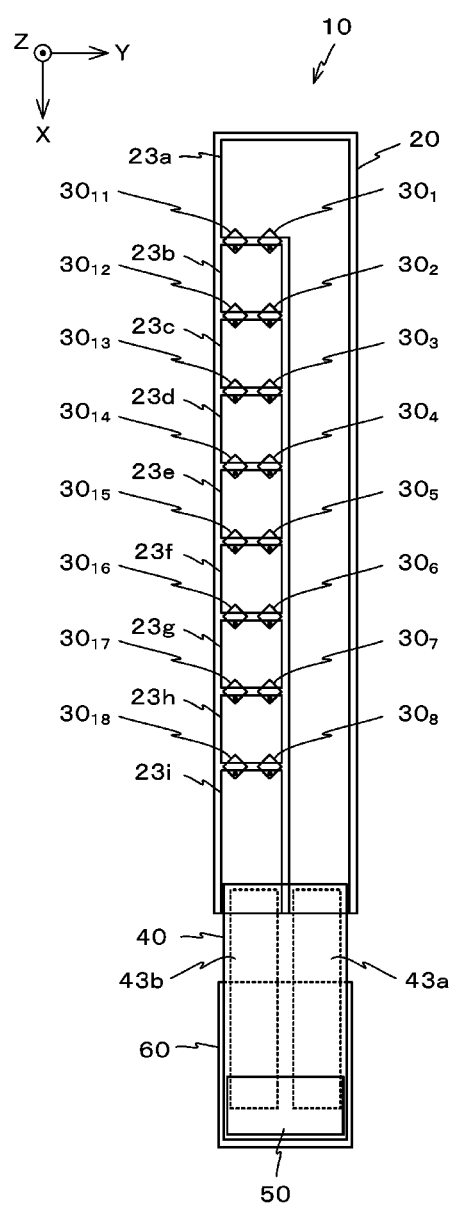
FIG. 21 is a diagram showing a modification of the light-emitting unit.

In the embodiment described above, a case in which the eight light-emitting devices $30_1$ to $30_8$ constituting the light-emitting panel 20 are connected in series. However, as shown in FIG. 21, the above embodiment is not limited to such a case and light-emitting devices $30_{11}$ to $30_{18}$ may be connected to the light-emitting devices $30_1$ to $30_8$ in parallel respectively. In FIG. 21, a black dot indicates an anode electrode. As shown in FIG. 21, by connecting the light-emitting devices $30_{11}$ to $30_{18}$ to the light-emitting devices $30_1$ to $30_8$ in parallel respectively while the polarity of the light-emitting devices $30_1$ to $30_8$ and the polarity of the light-emitting devices $30_{11}$ to $30_{18}$ are matched respectively, the light-emitting devices $30_1$ to $30_8$ and the light-emitting devices $30_{11}$ to $30_{18}$ can simultaneously be turned on respectively.

Figure 22:
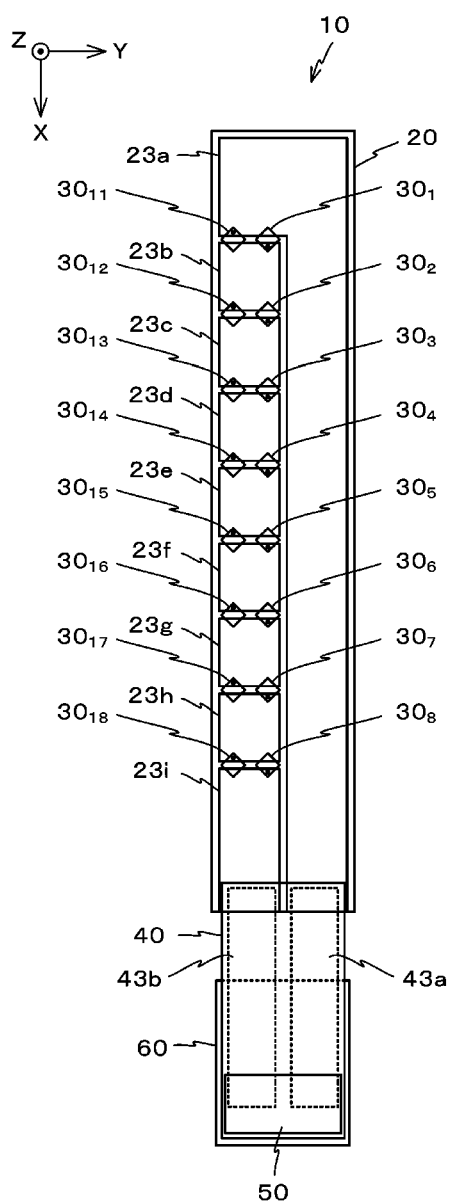
FIG. 22 is a diagram showing a modification of the light-emitting unit.

Also as shown in FIG. 22, by connecting the light-emitting devices $30_{11}$ to $30_{18}$ to the light-emitting devices $30_1$ to $30_8$ in parallel respectively such that the polarity of the light-emitting devices $30_1$ to $30_8$ and the polarity of the light-emitting devices $30_{11}$ to $30_{18}$ are opposite to each other respectively, the light-emitting devices $30_1$ to $30_8$ and the light-emitting devices $30_{11}$ to $30_{18}$ can separately be turned on respectively. More specifically, by inverting the voltage applied to the connector 50, each of the light-emitting devices $30_1$ to $30_8$ and each of the light-emitting devices $30_{11}$ to $30_{18}$ can alternately be turned on.

For example, by connecting a set of the light-emitting devices 30 that emit lights of different color tones in parallel such that, as described above, the polarities are opposite to each other, different colors can alternately be reproduced using the one light-emitting unit 10.

Figure 23:
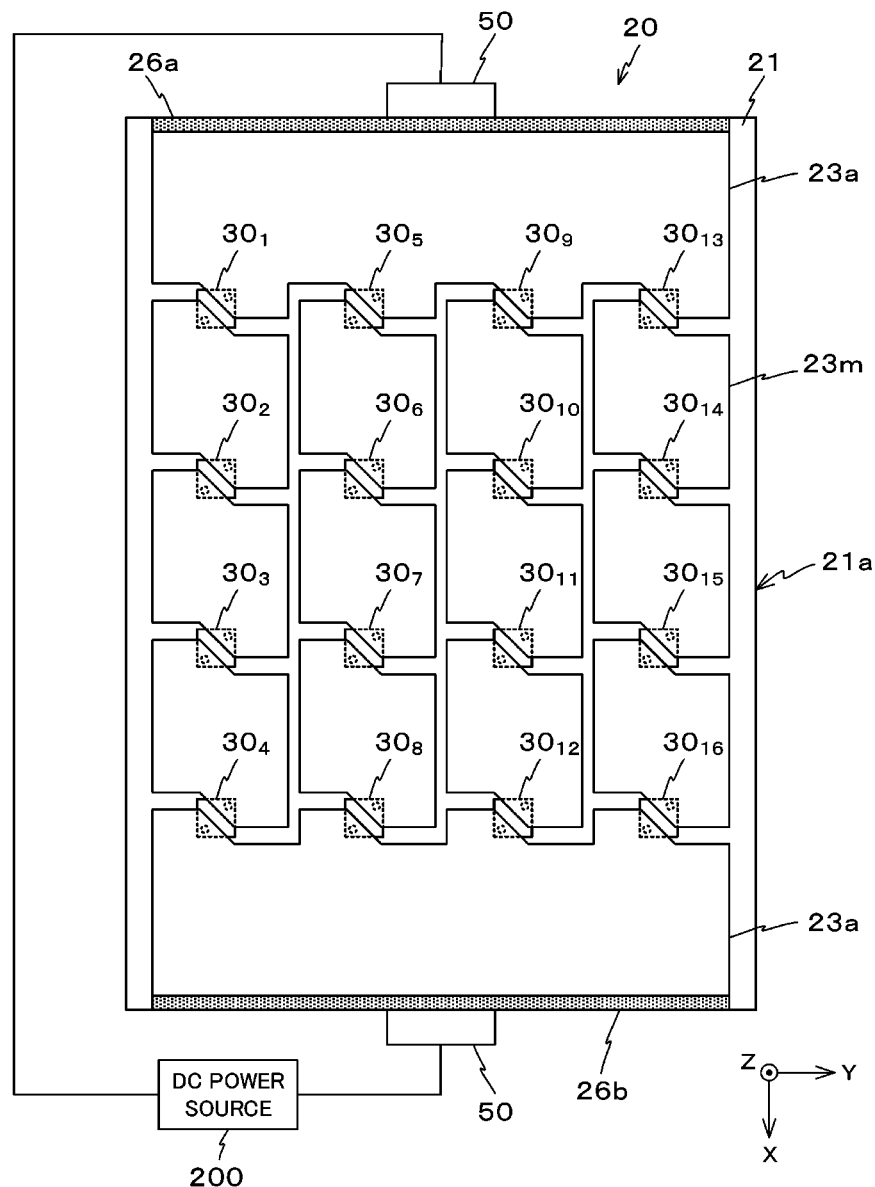
FIG. 23 is a diagram showing a modification of the light-emitting panel.

In the above embodiment, a case in which the eight light-emitting devices $30_1$ to $30_8$ constituting the light-emitting panel 20 are arranged in a row and connected in series to each other is described. However, the above embodiment is not limited to such a case and, for example, as shown in FIG. 23, the light-emitting devices 30 may be arranged in a plurality of rows. In the light-emitting panel 20 according to a modification shown in FIG. 23, a plurality of conductor patterns 23$m$, four in the Y-axis direction and three in the X-axis direction, is arranged in a matrix form between a pair of the conductor patterns 23$a$. An insulating zone 21$a$ is formed between each of the conductor patterns 23$a$, 23$m$ by removing a conductive film.

The light-emitting devices $30_1$ to $30_4$, the light-emitting devices $30_5$ to $30_8$, the light-emitting devices $30_9$ to $30_{12}$, and light-emitting devices $30_{13}$ to $30_{16}$ arranged in the X-axis direction are connected in series respectively. Then, a device group of the light-emitting devices $30_1$ to $30_4$, a device group of the light-emitting devices $30_5$ to $30_8$, a device group of the light-emitting devices $30_9$ to $30_{12}$, and a device group of the light-emitting devices $30_{13}$ to $30_{16}$ connected in series are connected in parallel.

Also as shown in FIG. 23, the conductor patterns 26A, 26B made of copper or silver are connected to the entire outer edge of the two conductor patterns 23$a$ respectively. Then, the DC power source 200 is connected to between the conductor patterns 26A, 26B via the connector 50. When a voltage is applied to between the conductor pattern 26A and the conductor pattern 26B by the DC power source 200, a voltage is applied to each of the light-emitting devices $30_1$ to $30_{16}$. Accordingly, the light-emitting devices $30_1$ to $30_{16}$ emit light. By arranging the light-emitting devices 30 in a matrix form as described above, the light-emitting panel 20 can be caused to emit light like a surface.

Figure 24:
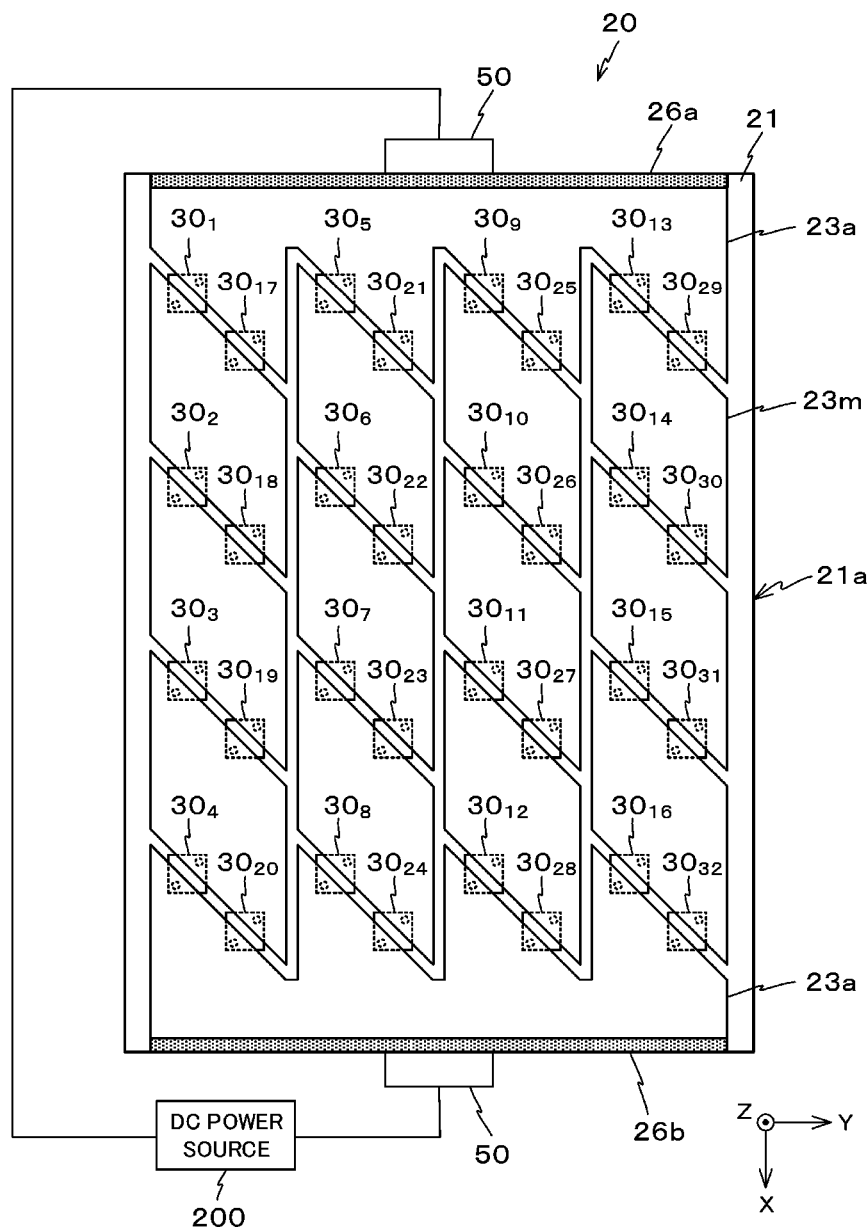
FIG. 24 is a diagram showing a modification of the light-emitting panel.

Also as shown in FIG. 24, other light-emitting devices $30_{17}$ to $30_{32}$ may be connected to the light-emitting devices $30_1$ to $30_{16}$ in parallel respectively. In this case, if the polarity of the light-emitting devices $30_1$ to $30_{16}$ and the polarity of the light-emitting devices $30_{17}$ to $30_{32}$ are equal, the polarity of the light-emitting devices $30_1$ to $30_{32}$ can simultaneously be turned on. On the other hand, if the polarity of the light-emitting devices $30_1$ to $30_{16}$ and the polarity of the light-emitting devices $30_{17}$ to $30_{32}$ are opposite, the light-emitting devices $30_1$ to $30_{16}$ and the light-emitting devices $30_{17}$ to $30_{32}$ can alternately be turned on by connecting an AC power source, instead of the DC power source 200. Accordingly, by making the color tone of the light-emitting devices $30_1$ to $30_{16}$ and that of the light-emitting devices $30_{17}$ to $30_{32}$ different, the light-emitting panel 20 can be caused to emit light in alternately different colors.

Figure 25:
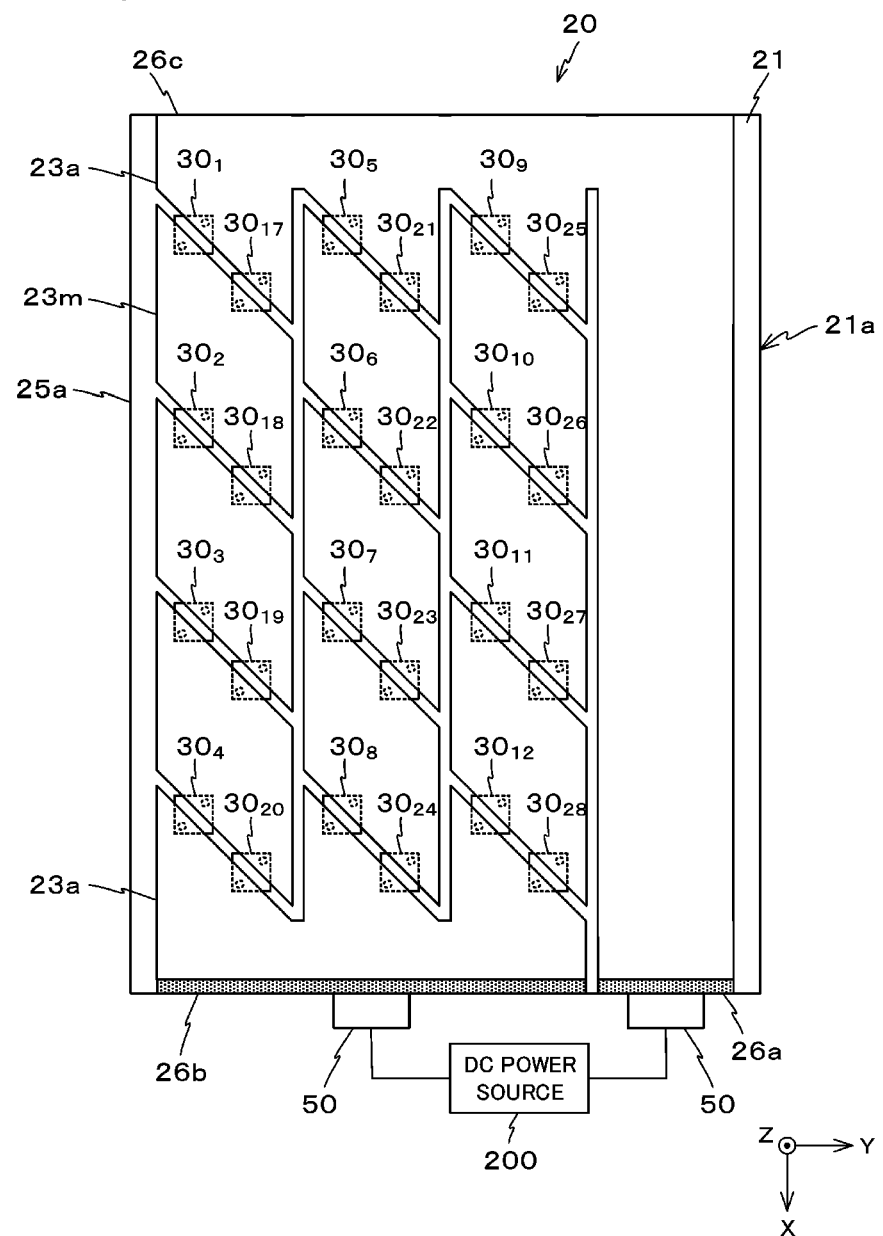
FIG. 25 is a diagram showing a modification of the light-emitting panel.

In the light-emitting panel 20 according to the above modification, as shown in FIG. 24, it is necessary to apply a voltage to a pair of the conductor patterns 23$a$ positioned on the −X side outer edge and the +X side outer edge. In this case, it is necessary to route an opaque wire around the light-emitting panel 20. Thus, as shown in FIG. 25, one of the conductor patterns 23$a$ may be routed to the neighborhood of the other conductor pattern 23$a$. Accordingly, as shown in FIG. 25, the opaque wire only needs to be arranged on one outer edge side (+X side). Therefore, growing uses of the light-emitting panel 20 can be expected.

In FIG. 25, a metal layer made of copper or silver whose longitudinal direction is the Y-axis direction may be attached to the entire outer edge on the −X side of the upper conductor pattern 23$a$. Accordingly, the magnitude of current flowing through each of the light-emitting devices 30 can be made uniform.

Figure 26:
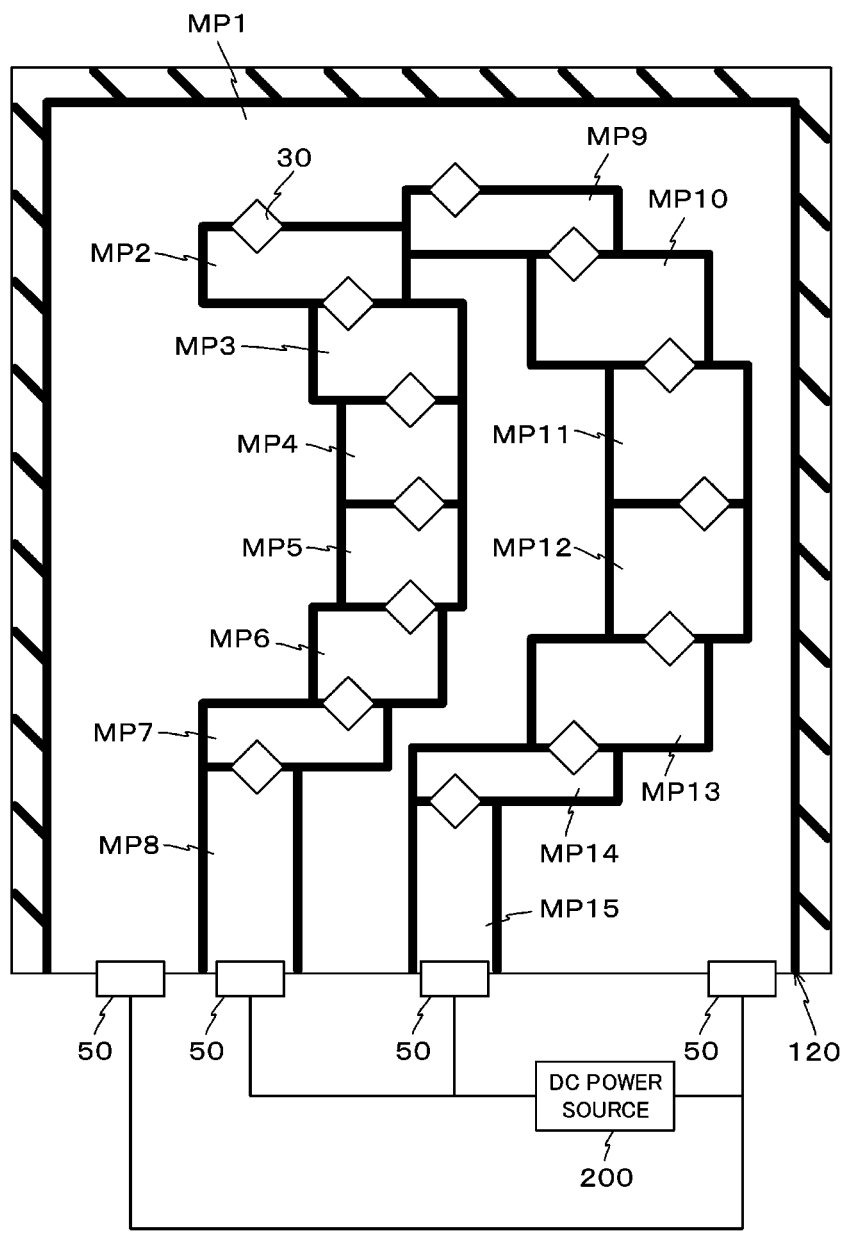
FIG. 26 is a diagram showing a modification of the light-emitting panel.

In the above embodiment, a case in which the light-emitting devices 30 are arranged on a straight line. However, the above embodiment is not limited to such a case and the light-emitting devices 30 may be arranged on a curve. FIG. 26 shows an example in which the light-emitting devices 30 are arranged on a curve. As shown in FIG. 26, conductor patterns MP2 to MP8 are serially arranged with respect to a conductor pattern MP1 and also conductor patterns MP9 to MP15 are serially arranged with respect to the conductor pattern MP1. Then, the light-emitting devices 30 are arranged by extending over neighboring conductor patterns. Thus, the light-emitting devices 30 arranged on a curve can be turned on by applying a voltage to between the conductor pattern MP1 and the conductor pattern MP8 and between the conductor pattern MP1 and the conductor pattern MP15 using the DC power source 200.

The example shown in FIG. 26 is a series-parallel circuit of light-emitting devices and by applying a positive (negative) potential to the light transmissive conductor pattern MP1 from both sides of the lower side and applying a negative (positive) potential to the two series circuits in the center simultaneously or alternately, light-emitting devices of the two series circuits can be turned on simultaneously or chronologically.

By forming conductor patterns in accordance with the arrangement position of the light-emitting device 30 as described above, the light-emitting device 30 can be arranged so as to be allowed to be turned on in any position.

In FIG. 26, fragmented conductor patterns are provided on three sides of the substrate, but such fragmented conductor patterns may also be provided between the two series circuits or outside the two series circuits.

By provided such fragmented patterns, leak paths due to conductive foreign matter can be reduced.

Second Embodiment

Next, a second embodiment of the present invention will be described with reference to the drawings. The same reference signs are used for the same or similar components to those in the first embodiment and the description thereof is omitted or provided briefly. The light-emitting unit 10 according to the present embodiment is different in that the light-emitting device 30 constituting the light-emitting panel 20 has an electrode on both sides.

Figure 27:
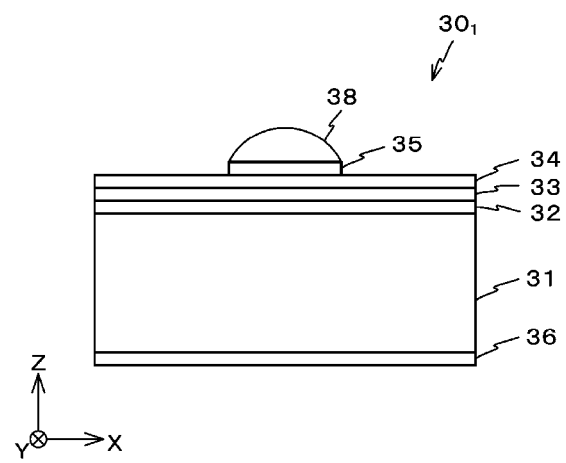
FIG. 27 is a side view of the light-emitting device.

FIG. 27 is a diagram representatively showing the light-emitting device $30_1$ of the light-emitting devices $30_1$ to $30_8$ according to the present embodiment. The light-emitting device 30 is a square LED chip and includes, as shown in FIG. 27, the base substrate 31, the N-type semiconductor layer 32 formed on the top surface of the base substrate 31, the active layer 33, and the P-type semiconductor layer 34. The pad 36 is formed on the undersurface of the base substrate 31 and the pad 35 is formed on the top surface of the P-type semiconductor layer 34. The pad 35 has the bump 38 in a semispherical shape formed thereon.

Figure 28:
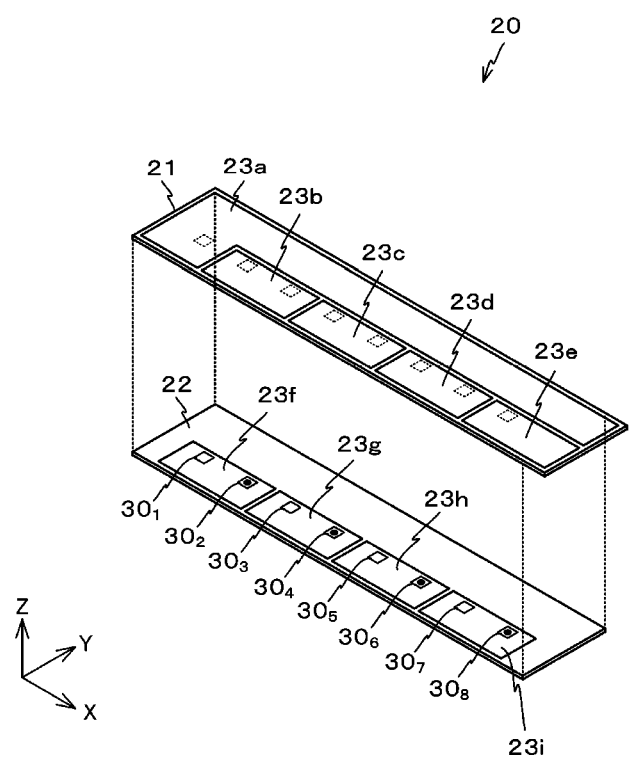
FIG. 28 is a perspective view of a light transmissive film.

FIG. 28 is a perspective view showing the light transmissive films 21, 22 constituting the light-emitting panel 20. On the undersurface of the light transmissive film 21, as shown in FIG. 28, the conductor pattern 23a in an L shape and the conductor patterns 23b to 23e in a rectangular shape arranged along the −Y side outer edge of the light transmissive film 21 are formed. Also, the conductor patterns 23g to 23i in a rectangular shape arranged along the −Y side outer edge of the light transmissive film 22 are formed on the top surface of the light transmissive film 22.

Figure 29:
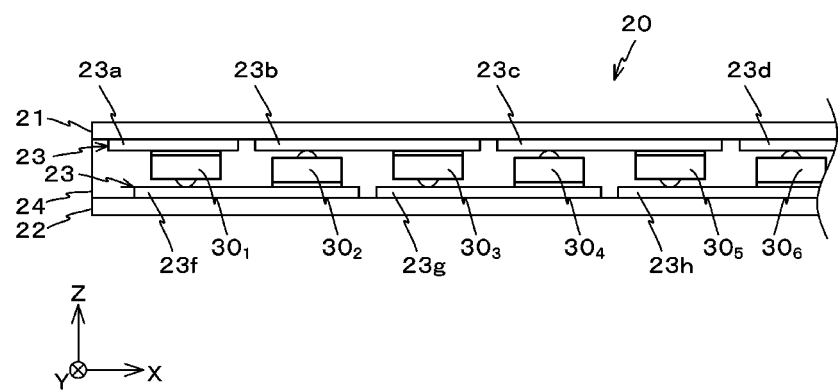
FIG. 29 is a side view of the light-emitting panel.

FIG. 29 is a side view of the light-emitting panel 20. As shown in FIG. 29, the light-emitting devices $30_1$ to $30_8$ are held by the resin layer 24 with which the space between the light transmissive film 21 and the light transmissive film 22 is filled.

As is evident from FIGS. 28 and 29, the light-emitting device $30_1$ is arranged between the conductor pattern 23a and the conductor pattern 23f. The light-emitting device $30_2$ is arranged between the conductor pattern 23f and the conductor pattern 23b. The light-emitting device $30_3$ is arranged between the conductor pattern 23b and the conductor pattern 23g. The light-emitting device $30_4$ is arranged between the conductor pattern 23g and the conductor pattern 23c. The light-emitting device $30_5$ is arranged between the conductor pattern 23c and the conductor pattern 23h. The light-emitting device $30_6$ is arranged between the conductor pattern 23h and the conductor pattern 23d. The light-emitting device $30_7$ is arranged between the conductor pattern 23d and the conductor pattern 23i. The light-emitting device $30_8$ is arranged between the conductor pattern 23i and the conductor pattern 23e.

In the light-emitting devices $30_1$, $30_3$, $30_5$, $30_7$ arranged as described above, the bump 38 is connected to a conductor pattern of the light transmissive film 22 and the pad 36 is connected to a conductor pattern of the light transmissive film 21. In the light-emitting devices $30_2$, $30_4$, $30_6$, $30_8$, the bump 38 is connected to a conductor pattern of the light transmissive film 21 and the pad 36 is connected to a conductor pattern of the light transmissive film 22. Accordingly, the light-emitting devices $30_1$ to $30_8$ are in a serially connected state.

Next, the manufacturing method of the light-emitting panel 20 constituting the light-emitting unit 10 described above will be described. The conductor layer like a mesh is formed on the surface of the light transmissive films 21, 22 made of PET using the subtract method or the additive method. Then, the conductor patterns 23a to 23e are formed on the surface of the light transmissive film 21 and the conductor patterns 23f to 23i are formed on the surface of the light transmissive film 22 by cutting the conductor layer 23 using laser. At this point, the connection pad P is formed in each of the conductor patterns 23a to 23i.

Next, a thermoplastic resin is provided on the surface of the light transmissive film 21 and the light-emitting devices $30_1$ to $30_8$ are arranged on the thermoplastic resin. Then, the light transmissive film 22 having the thermoplastic resin provided on the undersurface thereof is arranged on the top surface side of the light transmissive film 21. These light transmissive films 21, 22 are crimped by heating in a vacuum atmosphere. The light-emitting panel 20 is finished by undergoing the above processes.

In the present embodiment, as described above, the light-emitting device 30 is connected by the conductor patterns 23a to 23i. These conductor patterns 23a to 23i are formed from a metal thin film whose line width is about 10 μm. Thus, light transmissive property and flexibility of the light-emitting panel 20 can sufficiently be secured. Because the conductor patterns 23a to 23i are formed in a plane shape, the resistance of the circuit that supplies power to the light-emitting device 30 can be reduced. Accordingly, power can efficiently be supplied to the light-emitting device.

Figure 30:
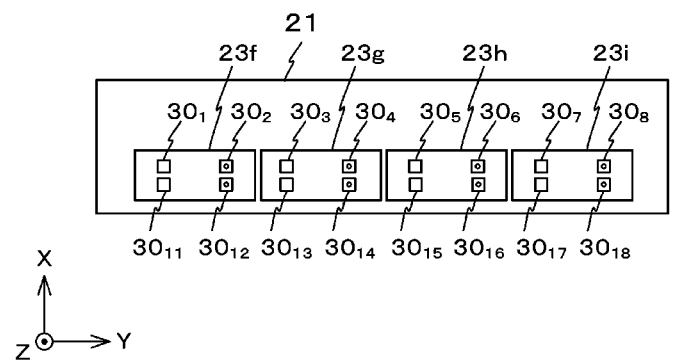
FIG. 30 is a diagram showing a modification of the light-emitting panel.

In the embodiment described above, a case in which the eight light-emitting devices $30_1$ to $30_8$ constituting the light-emitting panel 20 are connected in series is described. However, as is evident from FIG. 30, the above embodiment is not limited to such a case and the light-emitting devices $30_{11}$ to $30_{18}$ may be connected to the light-emitting devices $30_1$ to $30_8$ in parallel respectively. In FIG. 30, a white circle indicates an anode electrode. By connecting the light-emitting devices $30_{11}$ to $30_{18}$ to the light-emitting devices $30_1$ to $30_8$ in parallel respectively while the polarity of the light-emitting devices $30_1$ to $30_8$ and the polarity of light-emitting devices $30_{11}$ to $30_{18}$ are matched respectively, the light-emitting devices $30_1$ to $30_8$ and the light-emitting devices $30_{11}$ to $30_{18}$ can simultaneously be turned on respectively.

Figure 31:
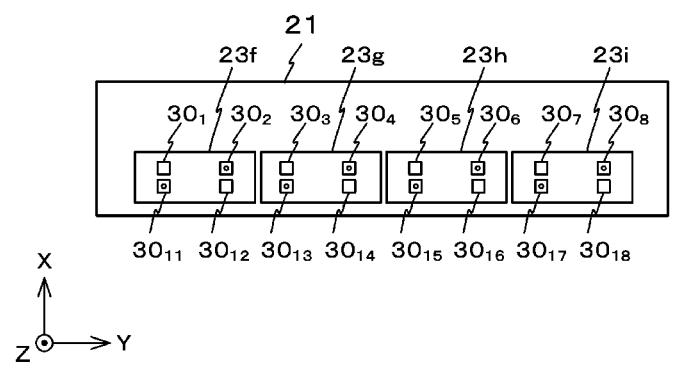
FIG. 31 is a diagram showing a modification of the light-emitting panel.

Also as is evident from FIG. 31, by connecting the light-emitting devices $30_{11}$ to $30_{18}$ to the light-emitting devices $30_1$ to $30_8$ in parallel respectively such that the polarity of the light-emitting devices $30_1$ to $30_8$ and the polarity of the light-emitting devices $30_{11}$ to $30_{18}$ are opposite to each other respectively, the light-emitting devices $30_1$ to $30_8$ and the light-emitting devices $30_1$ to $30_{18}$ can separately be turned on respectively. More specifically, by inverting the voltage applied to the connector 50, each of the light-emitting devices $30_1$ to $30_8$ and each of the light-emitting devices $30_{11}$ to $30_{18}$ can alternately be turned on.

For example, by connecting a set of the light-emitting devices 30 that emit lights of different color tones in parallel such that, as described above, the polarities are opposite to each other, different colors can alternately be reproduced using the one light-emitting unit 10.

Figure 32:
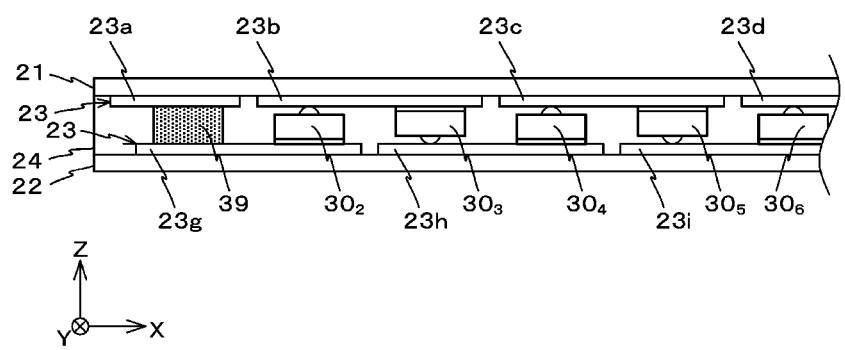
FIG. 32 is a diagram showing a modification of the light-emitting panel.

In the embodiment described above, a case in which the eight light-emitting devices $30_1$ to $30_8$ constituting the light-emitting panel 20 are connected in series is described. The number of the light-emitting devices 30 is not limited to the above case. If the number of the light-emitting devices 30 is odd, as shown in FIG. 32, a metal piece 39 such as a copper chip may be arranged in place of one of the light-emitting devices 30. In addition, the light-emitting devices may be arranged in a matrix form having a plurality of columns and a plurality of rows.

In the foregoing, the first embodiment and the second embodiment have been described, but the present invention is not limited by the above embodiments. For example, in each of the above embodiments, a mesh pattern is made of copper or silver. However, the mesh pattern is not limited to the above example and may be formed of a metal such as gold (Au) or platinum (Pt).

FIGS. 33A, 33B, 34A, and 34B are plan views illustrating the mode of the connection pad P of a mesh pattern used for the light-emitting device configured to have an electrode on both sides described with reference to FIGS. 27 to 32.

In the case of a light-emitting device configured to have an electrode on both sides, the connection on the bump side (A) and the connection on the rear side on the opposite side of the bump (B) can be used to connect to a mesh pattern.

In the case of (A), a conductive bump is provided on the surface electrode of a light-emitting device as described above and for the connection to a mesh pattern, methods such as a) arranging a bad similar to one when two electrodes are configured on one side, b) arranging a mesh smaller than the bump diameter (the mesh area is about the bump diameter to 1.5 times the bump diameter), and c) arranging a bump electrode at the intersection of mesh without arranging a pad are known.

Figure 33A:
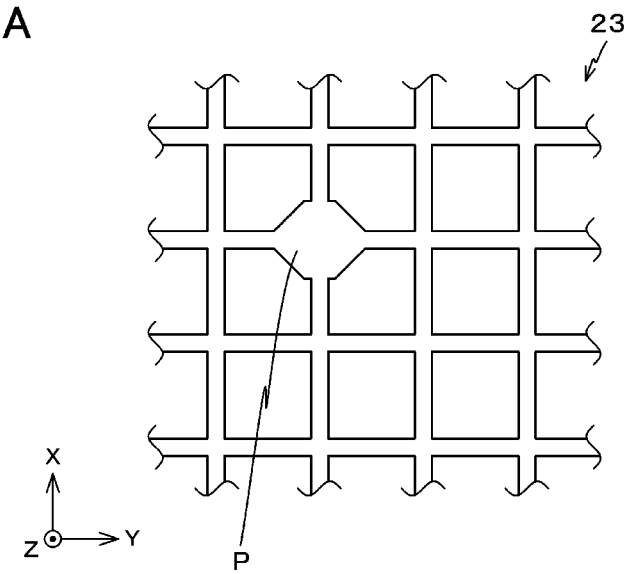
FIG. 33A is a diagram illustrating the procedure for manufacturing the conductor pattern.
Figure 33B:
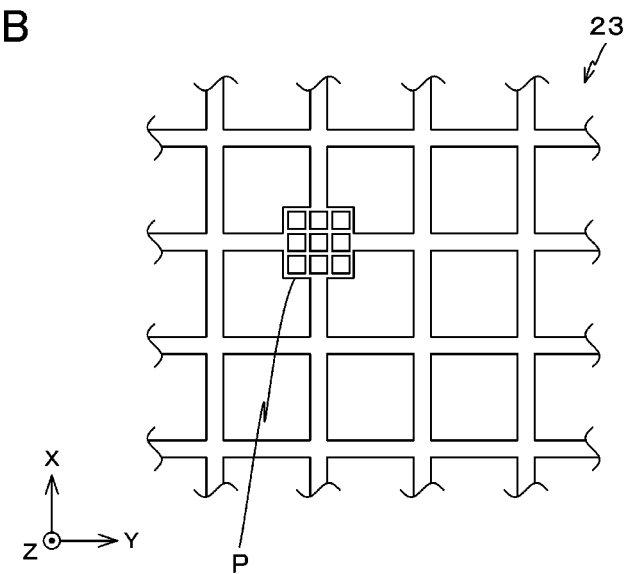
FIG. 33B is a diagram illustrating the procedure for manufacturing the conductor pattern.

FIG. 33A shows an example of the connection pad P in the case of (A) a) and FIG. 33B shows an example of the pad in the case of A) b).

In the case of (B), on the other hand, the connection on the opposite side of the bump of a light-emitting device, that is, the connection to a rear-side electrode is used and for the connection to a mesh pattern, methods such as a) arranging a pad (the pad area is about half to 1.5 times the chip size), b) arranging a mesh smaller than the chip size (the mesh area is about half to 1.5 times the chip size), and c) arranging a bump opposite-side electrode at the intersection of mesh without arranging a pad are known.

Figure 34A:
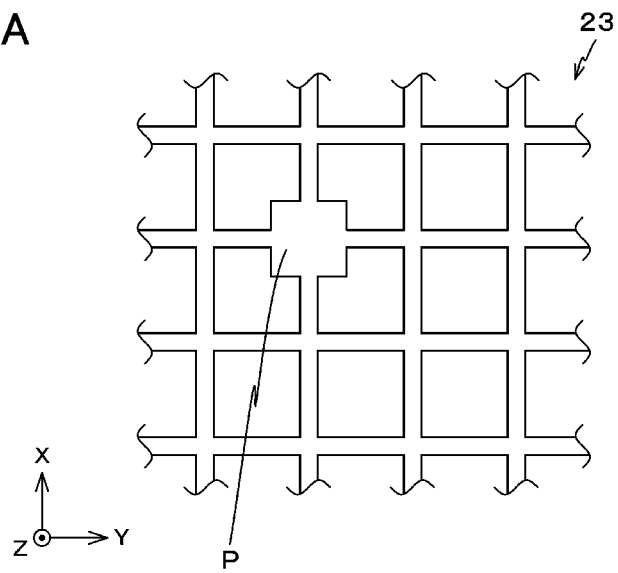
FIG. 34A is a diagram illustrating the procedure for manufacturing the conductor pattern.
Figure 34B:
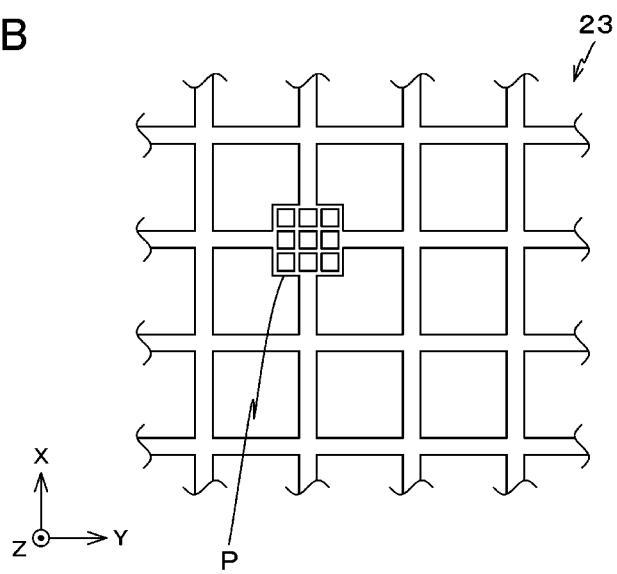
FIG. 34B is a diagram illustrating the procedure for manufacturing the conductor pattern.

FIG. 34A shows an example of the connection pad P in the case of (B) a) and FIG. 34B shows an example of the pad in the case of B) b).

In the examples of the drawings, the pad on the bump side is slightly smaller than a square of the mesh and the pad on the opposite side is as large as the square of the mesh, but the present embodiment is not limited to such an example.

In all examples of FIGS. 33A, 33B, 34A, and 34B, the connection pad P may be placed at an intersection of the mesh pattern or between neighboring mesh intersections like extending over two meshes. If, as shown in FIGS. 34A and 34B, the pad is as large as the square of the mesh, the connection pad P can also be arranged like filling up one square of the mesh pattern.

The mesh pattern with a pad in FIGS. 33A, 33B, 34A, and 34B may be manufactured in two work processes, but the mesh pattern with a connection pad in the final shape as shown in FIGS. 33A, 33B, 34A, and 34B may also be formed in one photolithography process without dividing patterning into two processes.

Alternatively, some connection pad P may be made to be regularly scattered in, for example, a matrix shape in a mesh pattern using the mesh pattern in FIGS. 33A, 33B, 34A, and 34B so that the area to be used for a circuit may be selected in accordance with the connection layout of light-emitting devices requested by each luminescence device.

Third Embodiment

Hereinafter, a third embodiment of the present invention will be described using the drawings. The same reference signs are used for the same or similar components to those in each of the above embodiments and the description thereof is omitted or provided briefly.

The light-emitting unit 10 according to the present embodiment is different from the light-emitting unit according to the first embodiment in that a conductor pattern is not a mesh pattern and is formed from a substantially light transmissive conductor.

Figure 35:
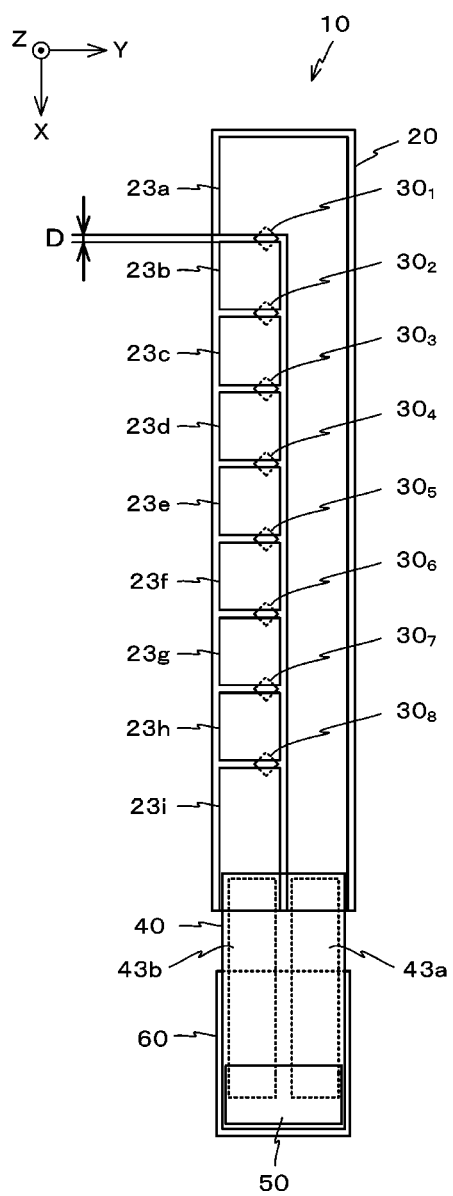
FIG. 35 is a plan view of the light-emitting unit.

FIG. 35 is a plan view of the light-emitting unit 10. As is evident from FIG. 35, the conductor layer 23 includes the conductor pattern 23a in an L shape formed along the +Y side outer edge of the light transmissive film 21 and the conductor patterns 23b to 23i in a rectangular shape arranged along the −Y side outer edge of the light transmissive film 21. The conductor patterns 23a to 23i are made of a transparent conductive material such as indium tin oxide (ITO). In the light-emitting unit 10, a distance D between the conductor patterns 23a to 23i is about 100 μm or less.

In the light-emitting unit 10, the light transmissive film 22 has a shorter length in the X-axis direction than the light transmissive film 21. Thus, as is evident from FIG. 3, a +X side end of the conductor pattern 23a and the conductor pattern 23i constituting the conductor layer 23 is exposed.

Next, the manufacturing method of the light-emitting panel 20 constituting the light-emitting unit 10 described above will be described. First, the light transmissive film 21 made of PET is prepared and the conductor layer 23 made of ITO is formed by applying the sputtering method or the vapor deposition method to the surface thereof. Then, the conductor layer 23 is patterned using laser to form the conductor patterns 23a to 23i.

Figure 36:
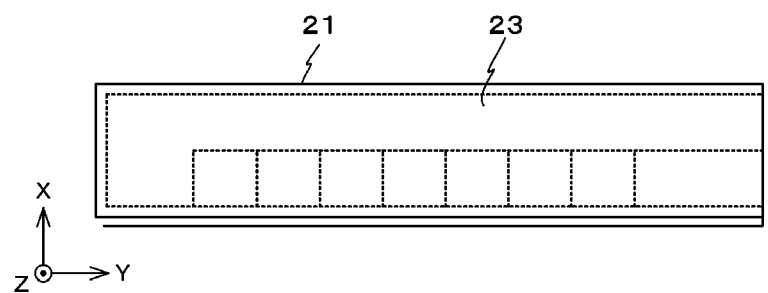
FIG. 36 is a diagram illustrating the procedure for manufacturing the conductor pattern.
Figure 37:
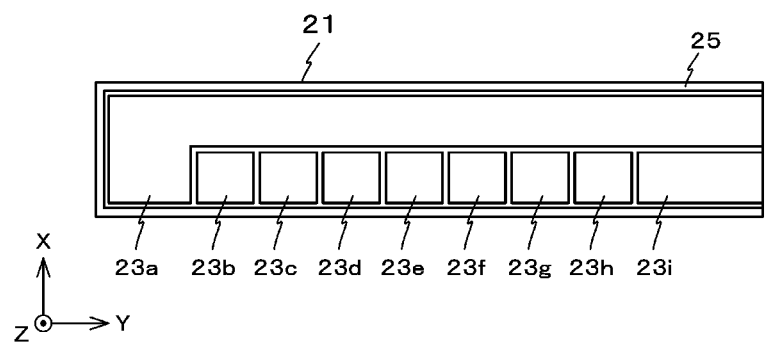
FIG. 37 is a diagram illustrating a procedure for manufacturing the conductor pattern.

For the patterning of the conductor layer 23, an ITO film formed on the entire top surface of the light transmissive film 21 is irradiated with laser light. Then, the laser spot of the laser light is moved along a dotted line shown in FIG. 36. Accordingly, the conductor layer 23 is cut along the slit of the dotted line and, as shown in FIG. 37, the conductor patterns 23a to 23i are formed. Also, the conductor pattern 25 surrounding these conductor patterns 23a to 23i is formed along the outer edge of the light transmissive film 21.

Figure 38:
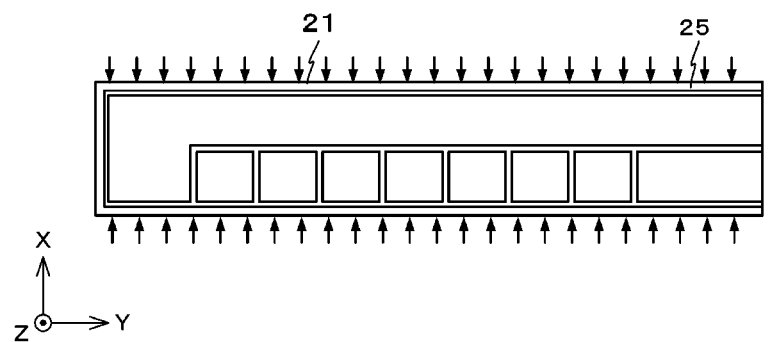
FIG. 38 is a diagram illustrating a procedure for manufacturing the conductor pattern.
Figure 39:
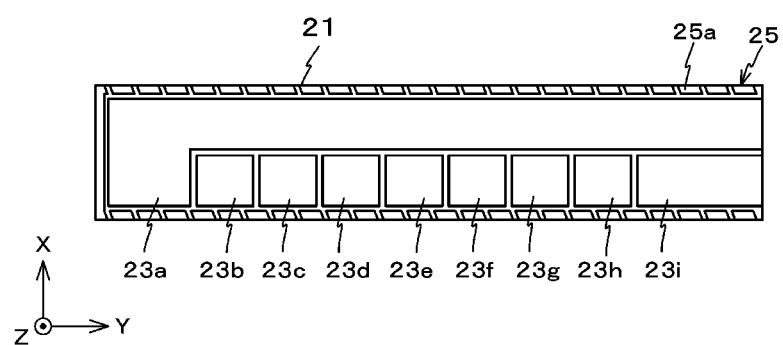
FIG. 39 is a diagram illustrating a procedure for manufacturing the conductor pattern.

Next, the conductor pattern 25 is cut in positions indicated by arrows in FIG. 38 using laser. Accordingly, as shown in FIG. 39, the conductor pattern 25 is fragmented into a plurality of chips 25a. The plurality of chips 25a are electrically insulated from each other and also insulated from the conductor patterns 23a to 23i.

Next, as shown in FIG. 16, a thermoplastic resin 240 is provided on the surface of the light transmissive film 21 on which the conductor patterns 23a to 23i are formed. Then, the light-emitting devices $30_1$ to $30_8$ are arranged on the thermoplastic resin 240.

Next, as shown in FIG. 17, the light transmissive film 22 provided with the thermoplastic resin 240 on the undersurface thereof is arranged on the top surface side of the light transmissive film 21. Then, each of the light transmissive films 21, 22 is crimped by heating in a vacuum atmosphere. Accordingly, first the bumps 37, 38 formed in the light-emitting device 30 penetrate the thermoplastic resin 240 to reach the conductor patterns 23a to 23i to be electrically connected to the conductor patterns 23a to 23i. Then, a space between the conductor pattern 25, the chips 25a, and the light transmissive films 21, 22, and the light-emitting device 30 is completely filled with the thermoplastic resin 240. The thermoplastic resin 240 becomes, as shown in FIG. 3, the resin layer 24 that holds the light-emitting device 30 between the light transmissive films 21, 22. The light-emitting panel 20 is finished by undergoing the above processes.

As shown in FIG. 9, the flexible cable 40 to which the reinforcing plate 60 is attached is connected to the light-emitting panel 20 configured as described above and the connector 50 is implemented on the flexible cable 40 to finish the light-emitting unit 10 shown in FIG. 1.

In the present embodiment, as described above, the light-emitting device 30 is connected by the conductor patterns 23a to 23i. These conductor patterns 23a to 23i are formed as plane patterns by patterning the transparent ITO film formed on the top surface of the light transmissive film 21. The ITO film has high light transmissive property and flexibility so that light transmissive property and flexibility of the light-emitting panel 20 can sufficiently be secured. Because the conductor patterns 23a to 23i are formed in a plane shape, the resistance of the circuit that supplies power to the light-emitting device 30 can be reduced. Accordingly, power can efficiently be supplied to the light-emitting device.

In the present embodiment, the conductor layer 23 formed from the conductor patterns 23a to 23i is formed on the top surface of the light transmissive film 21 of the pair of light transmissive films 21, 22. Thus, the light-emitting panel 20 according to the present embodiment is thinner than a light-emitting panel having a conductor layer formed on both of the top surface and the undersurface of the light-emitting device 30. As a result, flexibility and light transmissive property of the light-emitting panel 20 can be improved.

In the present embodiment, when the conductor patterns 23a to 23i of the light-emitting panel 20 are formed, the ITO film formed on the surface of the light transmissive film 21 is patterned using laser light. During the patterning, as shown in FIG. 39, the conductor pattern 25 formed around the conductor patterns 23a to 23i is fragmented into the plurality of chips 25a. Thus, the influence of conductive foreign matter generated in the manufacturing process of the light-emitting panel 20 can be reduced.

Figure 40:
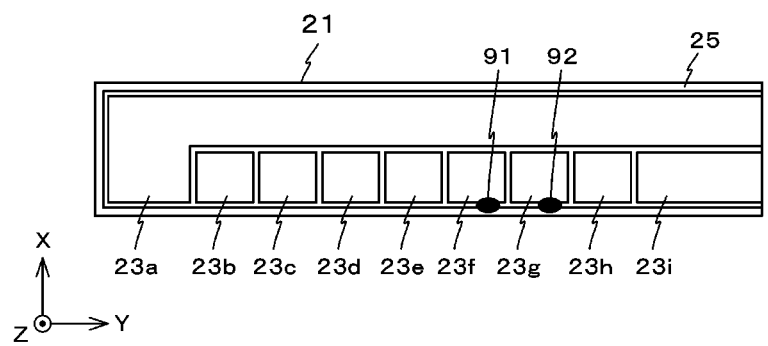
FIG. 40 is a diagram illustrating an effect of the present embodiment.

More specifically, when, as shown in FIG. 40, the conductor pattern 25 is not fragmented, if conductive foreign matter 91 adheres extending over the conductor pattern 25 and the conductor pattern 23f and conductive foreign matter 92 adheres extending over the conductor pattern 25 and the conductor pattern 23g, the conductor pattern 23f and the conductor pattern 23g will be connected via the conductor pattern 25. In such a case, the light-emitting device 30 arranged by extending over the conductor pattern 23f and the conductor pattern 23g will not be turned on.

Figure 41:
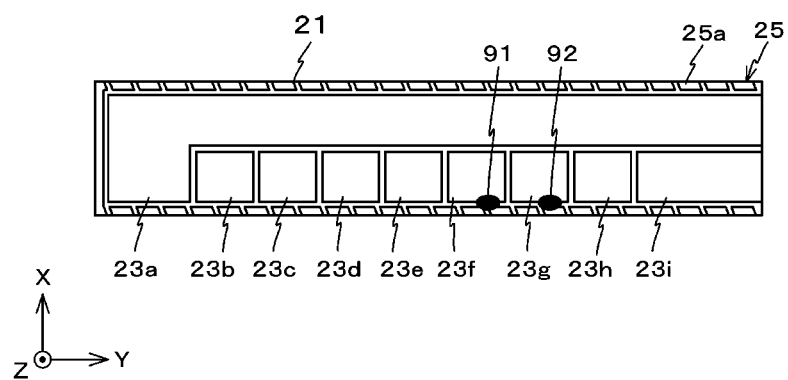
FIG. 41 is a diagram illustrating the effect of the present embodiment.

However, when, as shown in FIG. 41, the conductor pattern 25 is fragmented, if the conductive foreign matter 91 adheres extending over the conductor pattern 25 and the conductor pattern 23f and the conductive foreign matter 92 adheres extending over the conductor pattern 25 and the conductor pattern 23g, the conductor pattern 23f and the conductor pattern 23g will not be connected via the conductor pattern 25 because the conductor pattern 25 is fragmented into the chips 25a. Therefore, the influence of conductive foreign matter generated in the manufacturing process of the light-emitting panel 20 is reduced.

In the manufacturing process of the light-emitting panel 20, conductive foreign matter is frequently generated in a cut edge of the conductor layer 23. Thus, by fragmenting the conductor pattern 25 formed like surrounding the conductor patterns 23a to 23i, yields of the light-emitting panel 20 can significantly be improved.

In the above embodiment, a case in which the conductor patterns 23b to 23i are rectangular is described. However, the above embodiment is not limited to such a case and, as shown in FIG. 19, the outer edge of the conductor patterns 23b to 23i may be bent. In such a case, the light-emitting device 30 can be arranged such that the outer edge thereof is parallel to the X axis.

In the above embodiment, a case in which the light-emitting devices 30 are connected in series is described. However, the above embodiment is not limited to such a case and, as shown in FIG. 20, the light-emitting devices 30 may be connected in parallel.

In the embodiment described above, a case in which the eight light-emitting devices $30_1$ to $30_8$ constituting the light-emitting panel 20 are connected in series is described. However, as shown in FIG. 21, the above embodiment is not limited to such a case and light-emitting devices $30_1$ to $30_{18}$ may be connected to the light-emitting devices $30_1$ to $30_8$ in parallel respectively.

Also as shown in FIG. 22, by connecting the light-emitting devices $30_{11}$ to $30_{18}$ to the light-emitting devices $30_1$ to $30_8$ in parallel respectively such that the polarity of the light-emitting devices $30_1$ to $30_8$ and the polarity of the light-emitting devices $30_{11}$ to $30_{18}$ are opposite to each other respectively, the light-emitting devices $30_1$ to $30_8$ and the light-emitting devices $30_{11}$ to $30_{18}$ can separately be turned on respectively.

Figure 42:
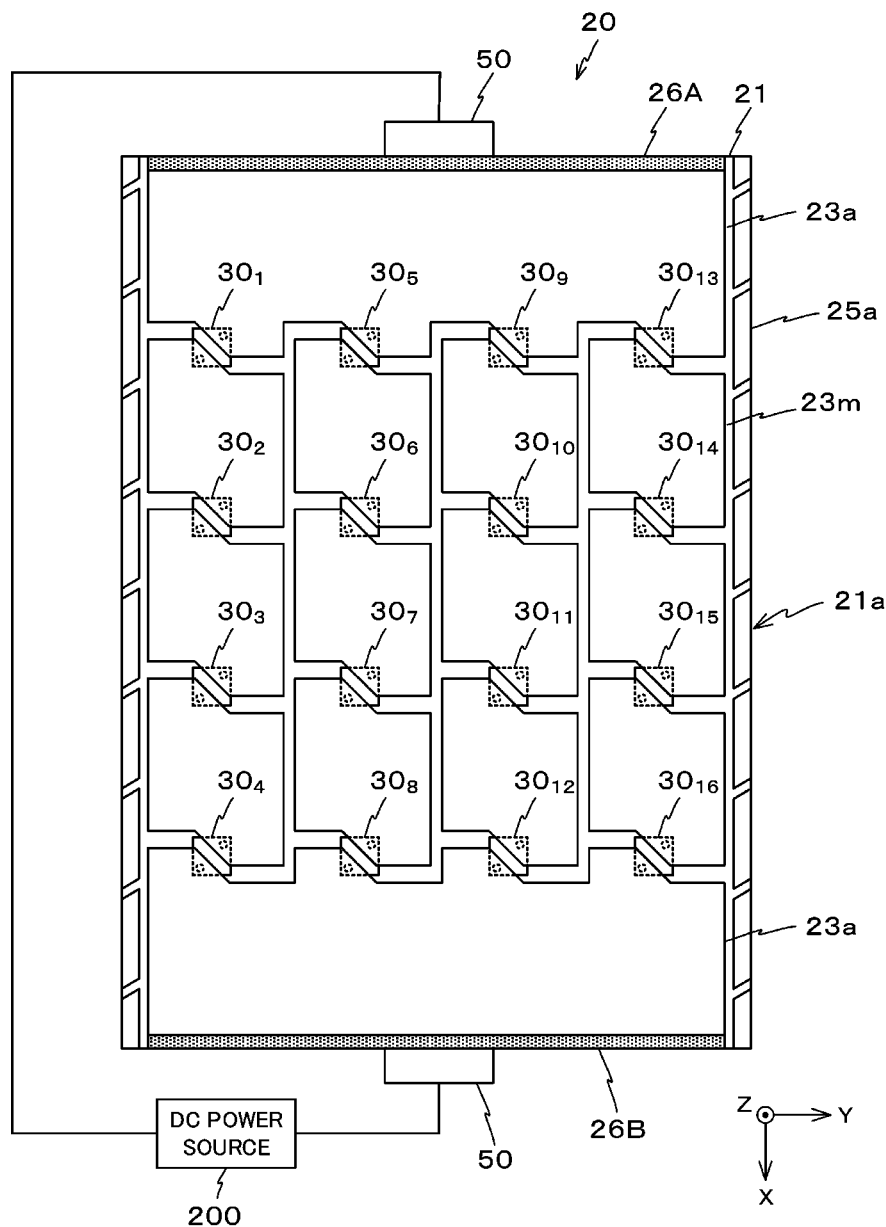
FIG. 42 is a diagram showing a modification of the light-emitting panel.

In the above embodiment, a case in which the eight light-emitting devices $30_1$ to $30_8$ constituting the light-emitting panel 20 are arranged in a row and connected in series to each other is described. However, the above embodiment is not limited to such a case and, for example, as shown in FIG. 42, the light-emitting devices 30 may be arranged in a plurality of rows. In the light-emitting panel 20 according to a modification shown in FIG. 42, the plurality of conductor patterns 23m, four in the Y-axis direction and three in the X-axis direction, is arranged in a matrix form between the pair of the conductor patterns 23a. An insulating zone 21a is formed between each of the conductor patterns 23a, 23m by removing a conductive film.

The light-emitting devices $30_1$ to $30_4$, the light-emitting devices $30_5$ to $30_8$, the light-emitting devices $30_9$ to $30_{12}$, and light-emitting devices $30_{13}$ to $30_{16}$ arranged in the X-axis direction are connected in series respectively. Then, a device group of the light-emitting devices $30_1$ to $30_4$, a device group of the light-emitting devices $30_5$ to $30_8$, a device group of the light-emitting devices $30_9$ to $30_{12}$, and a device group of the light-emitting devices $30_{13}$ to $30_{16}$ connected in series are connected in parallel.

Also as shown in FIG. 42, the conductor patterns 26A, 26B made of copper or silver are connected to the entire outer edge of the two conductor patterns 23a respectively. Then, the DC power source 200 is connected to between the conductor patterns 26A, 26B via the connector 50. When a voltage is applied to between the conductor pattern 26A and the conductor pattern 26B by the DC power source 200, a voltage is applied to each of the light-emitting devices $30_1$ to $30_{16}$. Accordingly, the light-emitting devices $30_1$ to $30_{16}$ emit light. By arranging the light-emitting devices 30 in a matrix form as described above, the light-emitting panel 20 can be caused to emit light like a surface.

Figure 43:
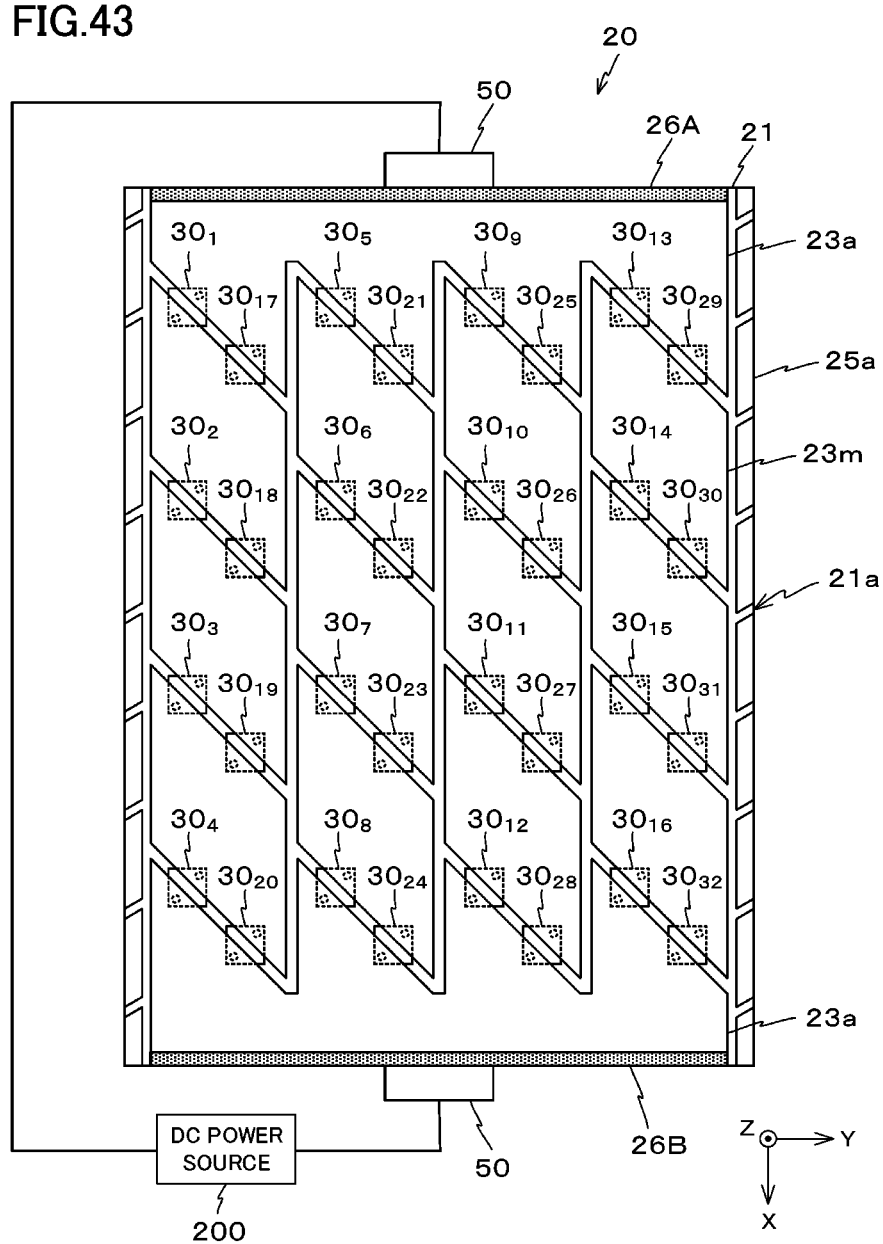
FIG. 43 is a diagram showing a modification of the light-emitting panel.

Also as shown in FIG. 43, the other light-emitting devices $30_{17}$ to $30_{32}$ may be connected to the light-emitting devices $30_1$ to $30_{16}$ in parallel respectively. In this case, if the polarity of the light-emitting devices $30_1$ to $30_{16}$ and the polarity of the light-emitting devices $30_{17}$ to $30_{32}$ are equal, the polarity of the light-emitting devices $30_1$ to $30_{32}$ can simultaneously be turned on. On the other hand, if the polarity of the light-emitting devices $30_1$ to $30_{16}$ and the polarity of the light-emitting devices $30_{17}$ to $30_{32}$ are opposite, the light-emitting devices $30_1$ to $30_{16}$ and the light-emitting devices $30_{17}$ to $30_{32}$ can alternately be turned on by connecting an AC power source, instead of the DC power source 200. Accordingly, by making the color tone of the light-emitting devices $30_1$ to $30_{16}$ and that of the light-emitting devices $30_{17}$ to $30_{32}$ different, the light-emitting panel 20 can be caused to emit light in alternately different colors.

Figure 44:
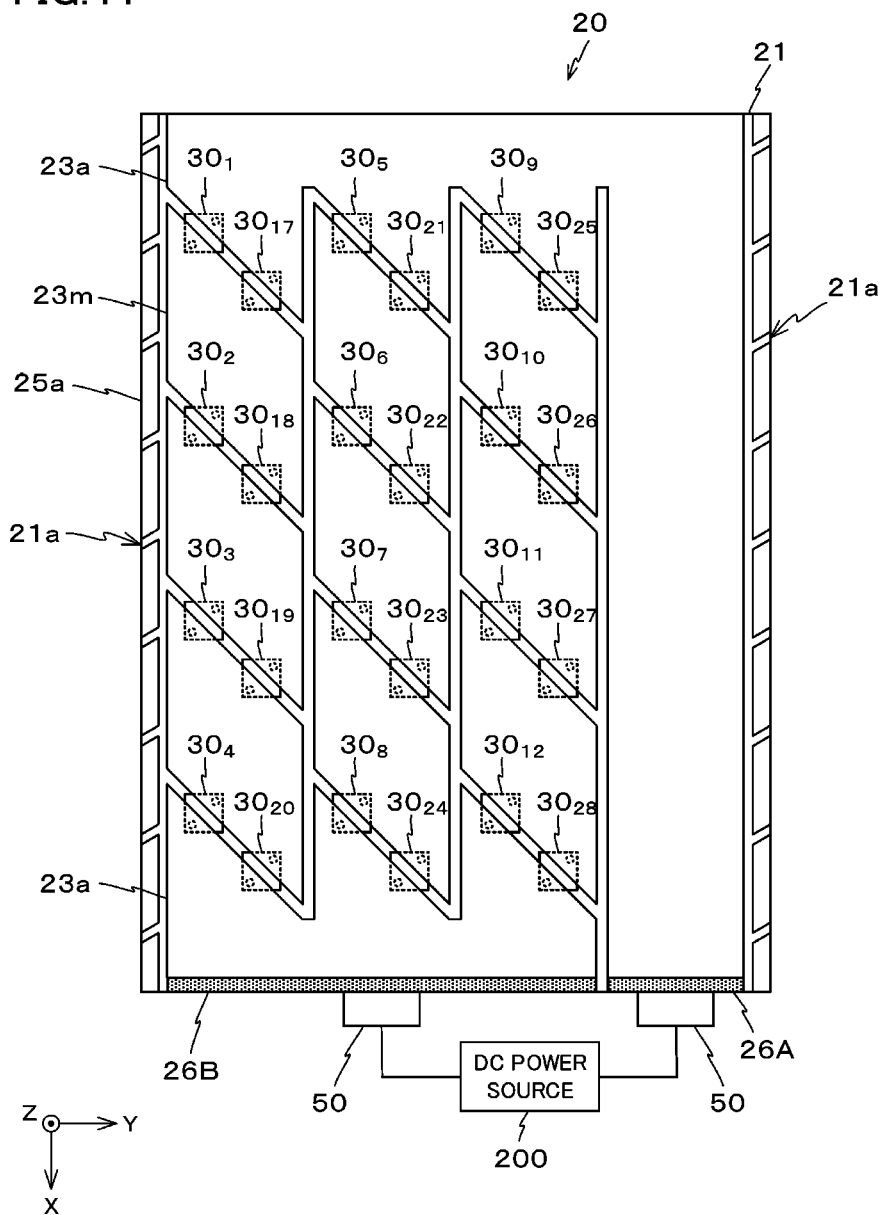
FIG. 44 is a diagram showing a modification of the light-emitting panel.

In the light-emitting panel 20 according to the above modification, as shown in FIG. 43, it is necessary to apply a voltage to the pair of conductor patterns 23a positioned on the −X side outer edge and the +X side outer edge. In this case, it is necessary to route an opaque wire around the light-emitting panel 20. Thus, as shown in FIG. 44, one of the conductor patterns 23a may be routed to the neighborhood of the other conductor pattern 23a. Accordingly, as shown in FIG. 44, the opaque wire only needs to be arranged on one outer edge side (+X side). Therefore, growing uses of the light-emitting panel 20 can be expected.

In FIG. 44, a metal layer made of copper or silver whose longitudinal direction is the Y-axis direction may be attached to the entire outer edge on the −X side of the upper conductor pattern 23a. Accordingly, the magnitude of current flowing through each of the light-emitting devices 30 can be made uniform.

In the above embodiment, a case in which the light-emitting devices 30 are arranged on a straight line. However, the above embodiment is not limited to such a case and the light-emitting devices 30 may be arranged, as shown in FIG. 26, on a curve.

Figure 45:
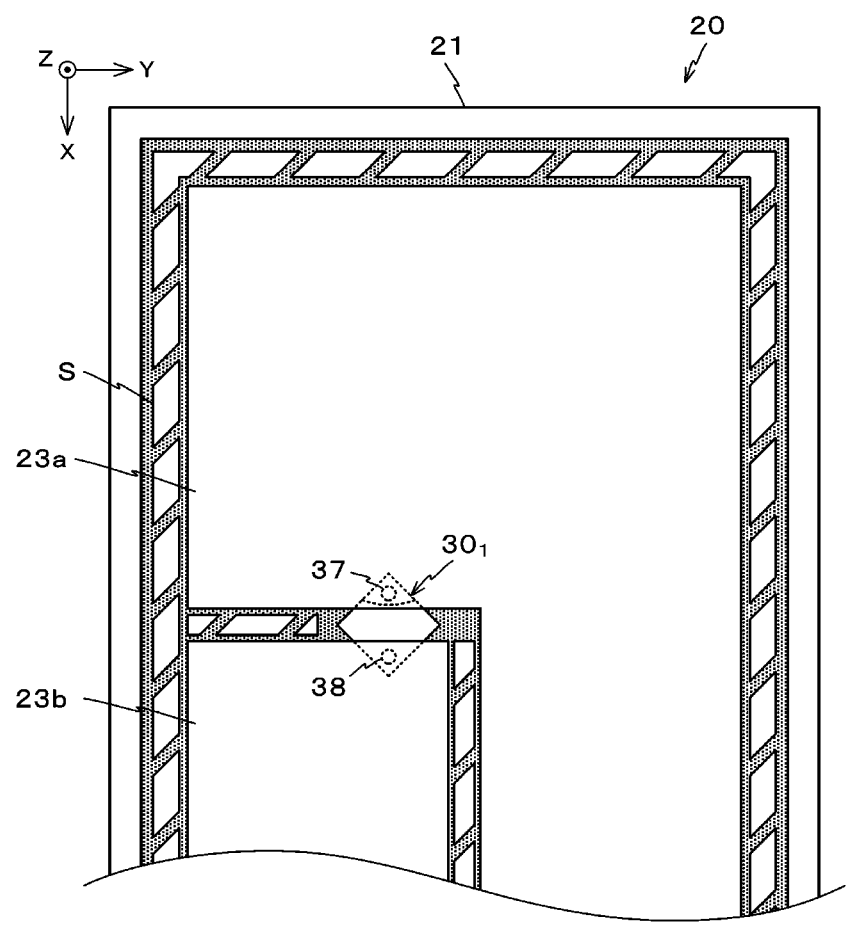
FIG. 45 is a diagram showing a modification of the light-emitting panel.

FIG. 45 is a diagram showing an example in which a conductor pattern S fragmented and having a pitch finer than that of conductor patterns constituting the circuit is provided in all portions excluding a connection portion of the light-emitting device 30. A colored portion in FIG. 45 indicates a separation groove. As shown in FIG. 45, the conductor pattern S fragmented and surrounded by the separation groove is provided between the conductor pattern 23a and the conductor pattern 23b of a circuit unit and between the conductor patterns 23a, 23b of the circuit unit and conductor patterns in the periphery of the light-emitting panel. By providing the conductor pattern S fragmented as described above around the conductor patterns of the circuit unit, leak paths due to conductive foreign matter can uniformly be reduced. Oblique grooves are illustrated in FIG. 45, but if desired, grooves may be parallel to the short side of the light transmissive film 21 or oblique grooves may be configured to cross each other. In the example of FIG. 45, no fragmented conductor pattern is provided in an area where the light-emitting device 30 is mounted and only the groove is present.

Fourth Embodiment

Next, a fourth embodiment of the present invention will be described with reference to the drawings. The same reference signs are used for the same or similar components to those in each of the above embodiments and the description thereof is omitted or provided briefly. The light-emitting unit 10 according to the present embodiment is different from the light-emitting unit according to the second embodiment in that a conductor pattern is not a mesh pattern and is formed from a substantially transparent conductor.

The conductor patterns 23a to 23i shown in FIG. 28 are made of a transparent conductive material such as indium tin oxide (ITO). Then, as shown in FIG. 29, the light-emitting devices $30_1$ to $30_8$ are held by the resin layer 24 with which the space between the light transmissive film 21 and the light transmissive film 22 is filled.

As is evident from FIGS. 28 and 29, the light-emitting device $30_1$ is arranged between the conductor pattern 23a and the conductor pattern 23f. The light-emitting device $30_2$ is arranged between the conductor pattern 23f and the conductor pattern 23b. The light-emitting device $30_3$ is arranged between the conductor pattern 23b and the conductor pattern 23g. The light-emitting device $30_4$ is arranged between the conductor pattern 23g and the conductor pattern 23c. The light-emitting device $30_5$ is arranged between the conductor pattern 23c and the conductor pattern 23h. The light-emitting device $30_6$ is arranged between the conductor pattern 23h and the conductor pattern 23d. The light-emitting device $30_7$ is arranged between the conductor pattern 23d and the conductor pattern 23i. The light-emitting device $30_8$ is arranged between the conductor pattern 23i and the conductor pattern 23e.

In the light-emitting devices $30_1$, $30_3$, $30_5$, $30_7$ arranged as described above, the bump 38 is connected to a conductor pattern of the light transmissive film 22 and the pad 36 is connected to a conductor pattern of the light transmissive film 21. In the light-emitting devices $30_2$, $30_4$, $30_6$, $30_8$, the bump 38 is connected to a conductor pattern of the light transmissive film 21 and the pad 36 is connected to a conductor pattern of the light transmissive film 22. Accordingly, the light-emitting devices $30_1$ to $30_8$ are in a serially connected state.

Next, the manufacturing method of the light-emitting panel 20 constituting the light-emitting unit 10 described above will be described. First, the light transmissive film 21 made of PET is prepared and the conductor layer 23 made of ITO is formed by applying the sputtering method or the vapor deposition method to the entire surface thereof. Then, the conductor layer 23 is patterned using laser to form the conductor patterns 23a to 23f.

Figure 46:
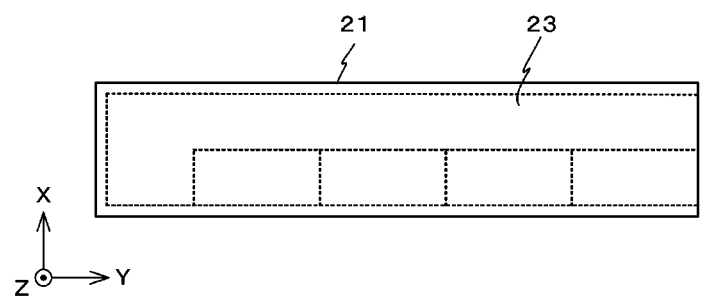
FIG. 46 is a diagram illustrating the procedure for manufacturing the conductor pattern.
Figure 47:
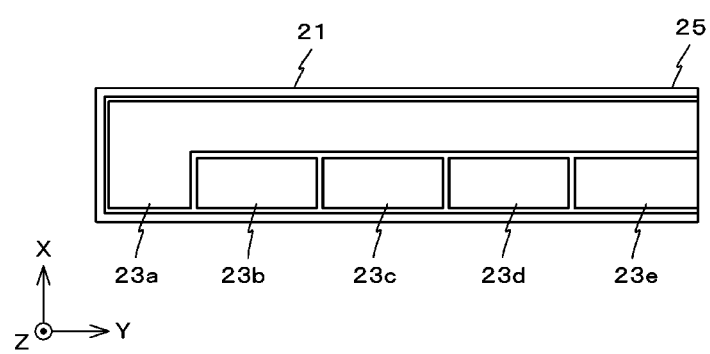
FIG. 47 is a diagram illustrating the procedure for manufacturing the conductor pattern.

For the patterning of the conductor layer 23, an ITO film formed on the top surface of the light transmissive film 21 is irradiated with laser light. Then, the laser spot of the laser light is moved along a dotted line shown in FIG. 46. Accordingly, the conductor layer 23 is cut along the dotted line and, as shown in FIG. 47, the conductor patterns 23a to 23e are formed. Also, the conductor pattern 25 surrounding these conductor patterns 23a to 23e is formed along the outer edge of the light transmissive film 21.

Figure 48:
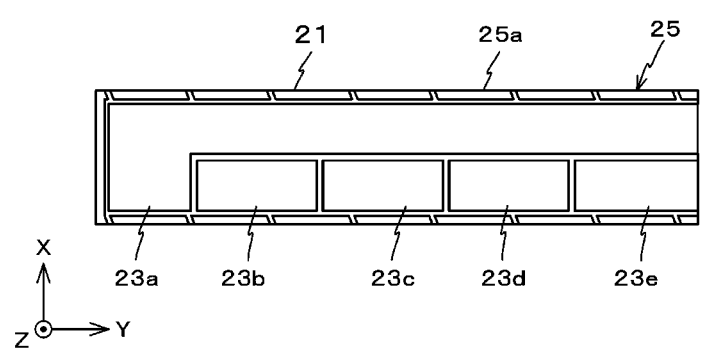
FIG. 48 is a diagram illustrating the procedure for manufacturing the conductor pattern.

Next, the conductor pattern 25 is cut using laser. Accordingly, as shown in FIG. 48, the conductor pattern 25 is fragmented into the plurality of chips 25a. The plurality of chips 25a are electrically insulated from each other and also insulated from the conductor patterns 23a to 23e.

Next, the light transmissive film 22 made of PET is prepared and the conductor layer 23 made of ITO is formed on the entire surface thereof using the sputtering method. Then, the conductor layer 23 is patterned using laser to form the conductor patterns 23f to 23i.

Figure 49:
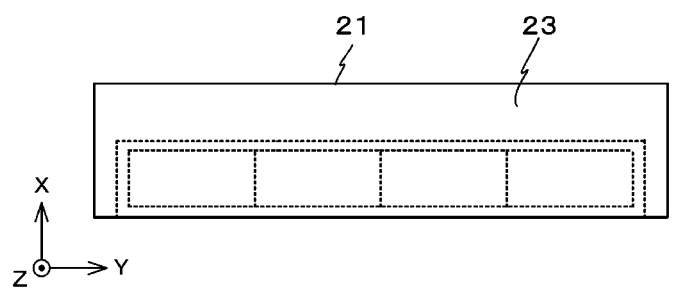
FIG. 49 is a diagram illustrating the procedure for manufacturing the conductor pattern.
Figure 50:
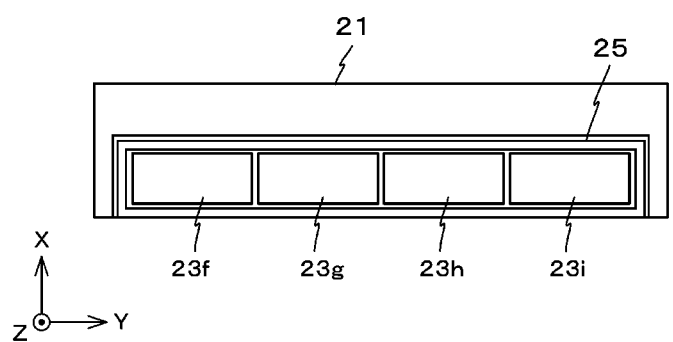
FIG. 50 is a diagram illustrating the procedure for manufacturing the conductor pattern.

For the patterning of the conductor layer 23, an ITO film formed on the top surface of the light transmissive film 22 is irradiated with laser light. Then, the laser spot of the laser light is moved along a dotted line shown in FIG. 49. Accordingly, the conductor layer 23 is cut along the dotted line and, as shown in FIG. 50, the conductor patterns 23f to 23i are formed. Also, the conductor pattern 25 surrounding these conductor patterns 23f to 23i is formed.

Figure 51:
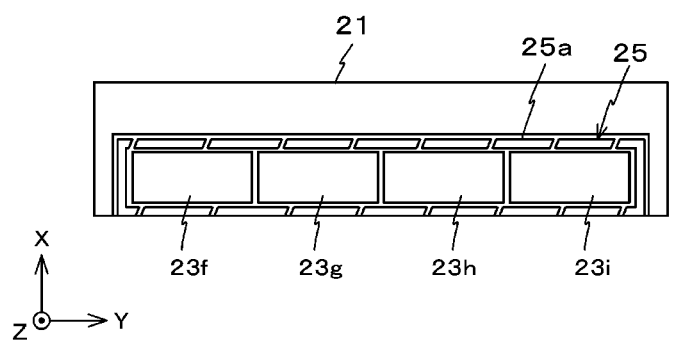
FIG. 51 is a diagram illustrating the procedure for manufacturing the conductor pattern.

Next, the conductor pattern 25 is cut using laser. Accordingly, as shown in FIG. 51, the conductor pattern 25 is fragmented into the plurality of chips 25a. The plurality of chips 25a are electrically insulated from each other and also insulated from the conductor patterns 23f to 23i.

Next, a thermoplastic resin is applied to the surface of the light transmissive film 21 and the light-emitting devices $30_1$ to $30_8$ are arranged on the thermoplastic resin. Then, the light transmissive film 22 having the thermoplastic resin applied to the undersurface thereof is arranged on the top surface side of the light transmissive film 21. These light transmissive films 21, 22 are crimped by heating in a vacuum atmosphere. The light-emitting panel 20 is finished by undergoing the above processes.

In the present embodiment, as described above, the light-emitting device 30 is connected by the conductor patterns 23a to 23i. These conductor patterns 23a to 23i are formed as plane patterns by patterning the transparent ITO film formed on the top surface of the light transmissive film 21. The ITO film has high transparency and flexibility so that light transmissive property and flexibility of the light-emitting panel 20 can sufficiently be secured. Because the conductor patterns 23a to 23i are formed in a plane shape, the resistance of the circuit that supplies power to the light-emitting device 30 can be reduced. Accordingly, power can efficiently be supplied to the light-emitting device.

In the present embodiment, the ITO film formed on the surface of the light transmissive film 21, 22 is patterned using laser light to form the conductor patterns 23a to 23i of the light-emitting panel 20. During the patterning, as shown in FIGS. 48 and 49, the conductor pattern 25 formed around the conductor patterns 23a to 23i is fragmented into the plurality of chips 25a. Thus, the influence of conductive foreign matter generated in the manufacturing process of the light-emitting panel 20 can be reduced.

In the embodiment described above, a case in which the eight light-emitting devices $30_1$ to $30_8$ constituting the light-emitting panel 20 are connected in series is described.

Figure 52:
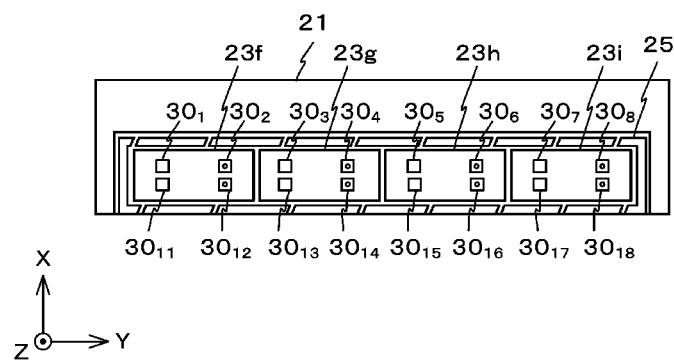
FIG. 52 is a diagram showing a modification of the light-emitting panel.

However, the above embodiment is not limited to such a case and as is evident from FIG. 52, the light-emitting devices $30_{11}$ to $30_{18}$ may be connected to the light-emitting devices $30_1$ to $30_8$ in parallel respectively. In FIG. 52, a white circle indicates an anode electrode. As is evident from FIG. 52, by connecting the light-emitting devices $30_{11}$ to $30_{18}$ to the light-emitting devices $30_1$ to $30_8$ in parallel respectively while the polarity of the light-emitting devices $30_1$ to $30_8$ and the polarity of the light-emitting devices $30_{11}$ to $30_{18}$ are matched respectively, the light-emitting devices $30_1$ to $30_8$ and the light-emitting devices $30_{11}$ to $30_{18}$ can simultaneously be turned on respectively.

Figure 53:
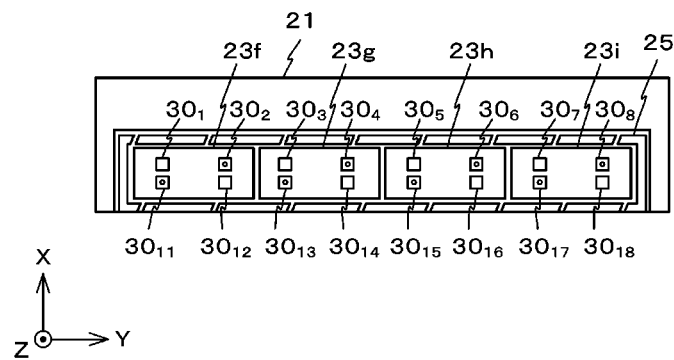
FIG. 53 is a diagram showing a modification of the light-emitting panel.

Also as is evident from FIG. 53, by connecting the light-emitting devices $30_{11}$ to $30_{18}$ to the light-emitting devices $30_1$ to $30_8$ in parallel respectively such that the polarity of the light-emitting devices $30_1$ to $30_8$ and the polarity of the light-emitting devices $30_{11}$ to $30_{18}$ are opposite to each other respectively, the light-emitting devices $30_1$ to $30_8$ and the light-emitting devices $30_{11}$ to $30_{18}$ can separately be turned on respectively. More specifically, by inverting the voltage applied to the connector 50, each of the light-emitting devices $30_1$ to $30_8$ and each of the light-emitting devices $30_{11}$ to $30_{18}$ can alternately be turned on.

For example, by connecting a set of the light-emitting devices 30 that emit lights of different color tones in parallel such that, as described above, the polarities are opposite to each other, different colors can alternately be reproduced using the one light-emitting unit 10.

In the embodiment described above, a case in which the eight light-emitting devices $30_1$ to $30_8$ constituting the light-emitting panel 20 are connected in series is described. The number of the light-emitting devices 30 is not limited to the above case. If the number of the light-emitting devices 30 is odd, as shown in FIG. 32, the metal piece 39 such as a copper chip may be arranged in place of one of the light-emitting devices 30. In addition, the light-emitting devices may be arranged in a matrix form having a plurality of columns and a plurality of rows.

In the foregoing, some embodiments of the present invention have been described, but the present invention is not limited by the above embodiments. In the first embodiment, for example, a case when the line width d1 of a thin film conductor constituting a conductor pattern is 10 μm and the array pitch d2 of the thin film conductor is about 300 μm is described. The line width d1 and the array pitch d2 can be changed in various ways. However, the line width d1 is preferably in the range of 1 μm to 100 μm and the array pitch d2 is in the range of 10 μm to 1000 μm.

FIG. 54 shows a correspondence table showing a transmittance Pe corresponding to the line width d1 and the array pitch d2. The unit of the array pitch d1, d2 is micrometer (μm). To secure light transmissive property of the light-emitting unit 10, setting the line width d1 and the array pitch d2 such that the transmittance Pe is, for example, 75% or more with reference to FIG. 54 can be considered. When the resistance of the conductor pattern is set to 100Ω or less, for example, setting the line width d1 and the array pitch d2 corresponding to a colored matrix can be considered. Accordingly, light transmissive property of the light-emitting unit 10 can be secured and also the resistance of conductor patterns can be reduced.

In the above embodiments, the light-emitting unit 10 including the eight light-emitting devices 30 has been described. However, the above embodiments are not limited to such an example and the light-emitting unit 10 may include nine light-emitting devices or more or seven light-emitting devices or less.

In the first embodiment and the second embodiment described above, conductor patterns are assumed to be made of copper or silver. However, the first embodiment and the second embodiment are not limited to such an example and conductor patterns may be made of a metal such as gold (Au) or platinum (Pt).

In the third embodiment and the fourth embodiment described above, a case when the conductor layer 23 is patterned using laser to form a conductor pattern is described. However, the third embodiment and the fourth embodiment are not limited to such an example and conductor patterns made of ITO may be formed by printing ITO ink generated by ITO being inked onto the light transmissive film 21.

A case when a conductive film is partitioned by a groove has been described, but the light transmissive conductive film may be partitioned by irradiating the light transmissive conductive film with an energy beam in an oxidizing or nitriding atmosphere to form an insulating layer in an irradiation area. That is, any of the groove and the insulating layer can be used as an insulating zone.

In the third embodiment and the fourth embodiment, ITO is used for conductor patterns. However, as a conductive film for conductor patterns, in addition to indium tin oxide (ITO), transparent conductive materials such as fluorine doped tin oxide (FTO), zinc oxide, and indium zinc oxide (IZO) can be used. A conductor pattern can be formed by, for example, forming a thin film by applying the sputtering method, the electron beam vapor deposition method or the like and patterning the obtained thin film by laser beam machining, etching treatment or the like.

In the first to fourth embodiments, an alloy, a mixture, a eutectic, or an amorphous material with gold, a AuSn alloy, silver, copper, nickel, or other metals may be used as a bump or solder, eutectic solder, a mixture of metallic fine particles and resin, or an anisotropic conductive material may also be used. Also, a wire bump using a wire bonder, electrolytic plating, electroless plating, a burned product of inkjet-printed ink containing metallic fine particles, or a bump formed by printing paste containing metallic fine particles, coating ball mounting, pellet mounting, or vapor-deposition sputtering may also be used.

As described here, for example, a conductive bump can be formed from a mixture of metallic fine particles and a resin. In this case, a conductive bump may be formed by, for example, mixing a metal such as silver (Ag) or copper (Cu) into a thermoplastic resin to produce paste, blowing droplets of the paste onto an electrode by the inkjet method or the needle dispense method to form a protrusion, and hardening the protrusion by heat treatment.

The melting point of the bump is desirably 180° C. or higher and more desirably 200° C. or higher. The upper limit thereof is 1100° C. or lower as a practical range. If the melting point of the bump is lower than 180° C., deficiencies arise in a vacuum heat pressing process in the manufacturing process of a luminescence device such as significant deformation of the bump, which makes it impossible to maintain a sufficient thickness and bump protrusion from the electrode, leading to lower luminous intensity of LED.

The melting point of a bump is, for example, the value of a melting point measured using a sample of about 10 mg at the rate of temperature rise of 5° C./rain using a DSC-60 differential scanning calorimeter manufactured by Shimadzu Corporation and the value of a solidus line temperature if the solidus line temperature and a liquidus line temperature are different.

The dynamic hardness DHV of a bump is 3 or more and 150 or less, desirably 5 or more and 100 or less, and more desirably 5 or more and 50 or less. If the dynamic hardness DHV of a bump is less than 3, the bump is deformed significantly in the vacuum heat pressing process in the manufacturing process of a luminescence device so that a sufficient thickness cannot be maintained. In addition, the bump protrudes from the electrode, causing deficiencies such as lower luminous intensity of LED. On the other hand, if the dynamic hardness DHV of a bump exceeds 150, the bump deforms a translucent support substrate in the vacuum heat pressing process in the manufacturing process of a luminescence device to cause poor appearance or poor connection, which is not preferable.

The dynamic hardness DHV of a bump is determined by, for example, a test using Shimadzu dynamic micro hardness tester DUH-W201S manufactured by Shimadzu Corporation at 20° C. In this test, a diamond pyramid indenter (Vickers indenter) whose facing angle is 136° is pushed into the bump at the loading rate of 0.0948 mN/s. Then, the test force (P/mN) when the indentation depth (D/μm) of the indenter reaches 0.5 μm is substituted into the following formula.

$$DHV = 3.8584 P/D2 = 15.4336 P$$

The height of a bump is desirably 5 μm or more and 50 μm or less, and more desirably 10 μm or more and 30 μm or less. If the height of a bump is less than 5 μm, the effect of preventing a short-circuit between a conductor pattern and a P-type semiconductor layer or between a conductor pattern and an N-type semiconductor layer is weakened, which is not preferable. On the other hand, if the height of a bump exceeds 50 μm, the bump deforms a translucent support substrate in the vacuum heat pressing process in the manufacturing process of a luminescence device to cause poor appearance or poor connection, which is not preferable.

The contact area of an electrode of the light-emitting diode body and a bump is desirably 100 μm$^2$ or more and 15,000 μm$^2$ or less, more desirably 400 μm$^2$ or more and 8,000 μm$^2$ or less. These dimensions are values measured in a stable environment in which the room temperature and the temperature of measured objects are 20° C.±2° C.

In a luminescence device according to the present embodiment, an electrode of the light-emitting diode body and a conductor pattern of the translucent support substrate are connected by vacuum heat pressing using a bump. Thus, the bump is electrically connected to the electrode of the light-emitting diode during vacuum heat pressing in a state in which at least a portion thereof is not melted. Therefore, the contact angle between the electrode surface of the light-emitting diode body and the bump is suitably 135 degrees or less.

As described in the first embodiment, as a resin layer formed between light transmissive films, for example, a thermoplastic resin in the first and third embodiments, a resin in sheet shape may be used or a resin may be applied. Only the thermoplastic resin on the lower side may be used without using the thermoplastic resin on the upper side. After electric connection of the electrode and conductor patterns is obtained by compressing the whole in which the light-emitting devices are sandwiched using the thermoplastic resin in upper and lower two layers, a similar configuration may be obtained by peeling the thermoplastic resin positioned on the opposite side of the electrode of the light-emitting device of the two-layer thermoplastic resin and attaching a thermoplastic resin having the same thickness as the thermoplastic resin having been peeled to the light transmissive film in the final stage by heating/compression.

In the first to fourth embodiments, the resin is not limited to the thermoplastic resin and a thermosetting resin may also be used.

In the embodiments described above, translucent films are used as a first insulating film and a second insulating film sandwiching light-emitting devices therebetween so that light can be emitted from both upper and lower sides of a light-emitting unit. However, if desired, one side may be made opaque or reflecting. In such a case, the insulating film itself may have such a function, but a film of an opaque or reflecting material may be attached to one side of the light-emitting unit formed from the above light transmissive film LED.

Some embodiments of the present invention have been described, but these embodiments have been presented by way of example and do not intend to limit the scope of the invention. These novel embodiments can be carried out in other various forms and various omissions, substitutions, or alterations can be made without deviating from the spirit of the invention. These embodiments and modifications thereof are included in the scope and spirit of the invention and also included in the inventions described in claims and equivalents thereof.

The present invention allows various embodiments and modifications without deviating from the spirit and scope in a broad sense of the present invention. The above embodiments are intended to describe the present invention and do not limited the scope of the present invention. That is, the scope of the present invention is set forth by claims, not embodiments. Then, various modifications made within the scope of claims and within the scope of significance of inventions equivalent thereto are considered to be within the scope of the present invention.

What is claimed is:

1. A flexible light emitting unit emitting light from an upper side and a lower side of the flexible light emitting unit comprising:
    a first light transmissive substrate that comprises a first light transmissive insulator and a conductive pattern on the first light transmissive insulator, the conductive pattern comprising a first mesh pattern having a first pad and a second mesh pattern having a second pad disposed with a predetermined distance from the first pad;
    a second light transmissive substrate that comprises a second light transmissive insulator, the second light transmissive substrate arranged opposite to the first light transmissive substrate;
    a light emitting diode comprising a first semiconductor layer, a second semiconductor layer, an active layer, a first electrode, a first bump, a second electrode and a second bump, the first electrode disposed on the first semiconductor layer, the second electrode disposed on the second semiconductor layer, the active layer between the first semiconductor layer and the second semiconductor layer, the first electrode connected to the first pad of the first mesh pattern, the second electrode connected to the second pad of the second mesh pattern, the light emitting diode between the first light transmissive substrate and the second light transmissive substrate; and
    a third light transmissive insulator in a space between the first light transmissive substrate and the second light transmissive substrate, wherein;
    at least a portion of the third light transmissive insulator is between the first mesh pattern and part of the second semiconductor layer,
    the first mesh pattern includes a plurality of first lines,
    the second mesh pattern includes a plurality of second lines,
    a width of one end of one first line of the plurality of first lines defining the first pad is larger than a first line width of each first line of the plurality of first lines,
    a width of one end of one second line of the plurality of second lines defining the second pad is larger than a second line width of each second line of the plurality of second lines,
    each first line of the plurality of first lines protrudes at a first end side of the first mesh pattern,
    each second line of the plurality of second lines protrudes at a second end side of the second mesh pattern,
    a pitch of the first bump and the second bump is equal to or less than 2 times a first pitch of the plurality of the first lines or a second pitch of the plurality of the second lines,
    the first line width of each first line, the second line width of each second line, the first pitch of the plurality of first lines, and the second pitch of the plurality of second lines are defined so that the transmittance of the first and second mesh patterns is 75% or more, and a resistance of the first and second mesh patterns is 100Ω or less, and wherein:
    the first and second line widths are 1 μm or more and 5 μm or less and the first and second pitches are 50 μm or more,
    the first and second line widths are 5 μm or more and 10 μm or less and the first and second pitches are 100 μm or more,
    the first and second line widths are 10 μm or more and 20 μm or less and the first and second pitches are 200 μm or more,
    the first and second line widths are 20 μm or more and 30 μm or less and the first and second pitches are 300 μm or more,
    the first and second line widths are 30 μm or more and 50 μm or less and the first and second pitches are 500 μm or more.

* * * * *